(12) United States Patent
Cho et al.

(10) Patent No.: US 12,327,583 B2
(45) Date of Patent: Jun. 10, 2025

(54) MEMORY CONTROLLER THAT TRANSMITS HAMMER ADDRESSES WITH DIFFERENT COMMAND PROTOCOLS AND MEMORY SYSTEM INCLUDING THE SAME

(71) Applicant: Samsung Electronics Co., Ltd., Suwon-si (KR)

(72) Inventors: Sungyong Cho, Anyang-si (KR); Hyeran Kim, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 17/692,447

(22) Filed: Mar. 11, 2022

(65) Prior Publication Data
US 2023/0067144 A1 Mar. 2, 2023

(30) Foreign Application Priority Data

Aug. 30, 2021 (KR) .................. 10-2021-0114407

(51) Int. Cl.
*G11C 11/406* (2006.01)
*G11C 11/408* (2006.01)
*H01L 25/065* (2023.01)

(52) U.S. Cl.
CPC ... *G11C 11/40611* (2013.01); *G11C 11/40615* (2013.01); *G11C 11/4087* (2013.01); *H01L 25/0657* (2013.01)

(58) Field of Classification Search
CPC ........................................ G11C 11/401–4099
See application file for complete search history.

(56) References Cited

U.S. PATENT DOCUMENTS

| | | |
|---|---|---|
| 9,311,984 B1 | 4/2016 | Hong et al. |
| 9,418,724 B2 | 8/2016 | Song |
| 9,690,505 B2 | 6/2017 | Benedict |
| 9,721,643 B2 | 8/2017 | Bains et al. |
| 10,032,501 B2 | 7/2018 | Ito et al. |
| 10,490,251 B2 | 11/2019 | Wolff |
| 10,607,679 B2 | 3/2020 | Nakaoka |
| 10,818,337 B2 | 10/2020 | Kuramori et al. |

(Continued)

OTHER PUBLICATIONS

Extended European Search Report dated Sep. 15, 2022 issued in corresponding European Appln. No. 22166491.5.

(Continued)

*Primary Examiner* — Alfredo Bermudez Lozada
(74) *Attorney, Agent, or Firm* — Harness, Dickey & Pierce, P.L.C.

(57) ABSTRACT

A memory controller to control a semiconductor memory device, includes a row hammer management circuit and a scheduler. The row hammer management circuit counts each of access addresses associated with accesses to a plurality of memory cell rows of the semiconductor memory device to store counting values therein and determines a hammer address associated with at least one memory cell row which is intensively accessed among from the plurality of memory cell rows and a type of the hammer address associated with an urgency of management of the hammer address based on the counting values. The scheduler transmits the hammer address to the semiconductor memory device according to a different command protocol based on the type of the hammer address.

20 Claims, 29 Drawing Sheets

(56) References Cited

U.S. PATENT DOCUMENTS

| | | |
|---|---|---|
| 10,860,222 B2 | 12/2020 | Shin et al. |
| 10,950,288 B2 | 3/2021 | Nale et al. |
| 10,969,997 B2 | 4/2021 | Nale |
| 11,037,617 B2 | 6/2021 | Gans |
| 11,264,079 B1 * | 3/2022 | Roberts .................... G11C 7/24 |
| 2018/0158507 A1 * | 6/2018 | Bang ................. G11C 11/40611 |
| 2018/0342283 A1 | 11/2018 | Lee et al. |
| 2019/0348107 A1 * | 11/2019 | Shin .................. G11C 11/40618 |
| 2019/0385667 A1 | 12/2019 | Morohashi et al. |
| 2020/0082873 A1 | 3/2020 | Wolff |
| 2020/0090729 A1 * | 3/2020 | Son ....................... G06F 3/0604 |
| 2020/0411095 A1 * | 12/2020 | Kim ....................... G11C 15/00 |
| 2021/0158862 A1 | 5/2021 | Okuma |

OTHER PUBLICATIONS

Taiwanese Office Action dated Jul. 11, 2023 issued in corresponding Taiwanese Patent Application No. 111111084.

* cited by examiner

| CMD | BK ORG | CS | CA0 | CA1 | CA2 | CA3 | CA4 | CA5 | CA6 | CK EDGE |
|---|---|---|---|---|---|---|---|---|---|---|
| ACT1 | Any | H | H | H | H | R14 | R15 | R16 | R17 | RE |
| ACT1 | BG | X | BA0 | BA1 | BH0 | BG1 | R11 | R12 | R13 | FE |
| ACT1 | 16B | X | BA0 | BA1 | BA2 | BA3 | R11 | R12 | R13 | FE |
| ACT1 | 8B | X | BA0 | BA1 | BA2 | V | R11 | R12 | R13 | FE |
| ACT2 | Any | H | H | H | L | R7 | R8 | R9 | R10 | RE |
| ACT2 | Any | X | R0 | R1 | R2 | R3 | R4 | R5 | R6 | FE |

FIG. 15

| CMD | BK ORG | CS | CA0 | CA1 | CA2 | CA3 | CA4 | CA5 | CA6 | CK EDGE |
|---|---|---|---|---|---|---|---|---|---|---|
| PRE -Per BK, All BK | Any | H | L | L | L | H | H | H | H | RE |
| | BG | X | BA0 | BA1 | BG0 | BG1 | V | V ("L") | AB | FE |
| | 16B | | BA0 | BA1 | BA2 | BA3 | | | | |
| | 8B | | BA0 | BA1 | BA2 | V | | | | |
| REF -Per BK, All BK | Any | H | L | L | L | H | H | H | L | RE |
| | BG | X | BA0 | BA1 | BG0 | RFM | SB0 | V | AB | FE |
| | 16B | | BA0 | BA1 | BA2 | | SB0 | V | | |
| | 8B | | BA0 | BA1 | BA2 | | V | SB1 | | |

FIG. 16

| CMD | BK ORG | CS | CA0 | CA1 | CA2 | CA3 | CA4 | CA5 | CA6 | CK EDGE |
|---|---|---|---|---|---|---|---|---|---|---|
| WR16 OR WR | Any | H | L | H | H | C0 | C3 | C4 | C5 | RE |
| | BG | X | BA0 | BA1 | BG0 | BG1 | | | | |
| | 16B | | BA0 | BA1 | BA2 | BA3 | C1 | C2 | AP | FE |
| | 8B | | BA0 | BA1 | BA2 | V | | | | |
| WR32 | BG/16B | H | L | L | H | L | C3 | C4 | C5 | RE |
| | BG | X | BA0 | BA1 | BG0 | BG1 | | | | |
| | 16B | | BA0 | BA1 | BA2 | BA3 | C1 | C2 | AP | FE |

FIG. 17

| CMD | BK ORG | CS | CA0 | CA1 | CA2 | CA3 | CA4 | CA5 | CA6 | CK EDGE |
|---|---|---|---|---|---|---|---|---|---|---|
| RD16 OR RD | Any | H | H | L | L | C0 | C3 | C4 | C5 | RE |
| | BG | X | BA0 | BA1 | BG0 | BG1 | C1 | C2 | AP | FE |
| | 16B | | BA0 | BA1 | BA2 | BA3 | | | | |
| | 8B | | BA0 | BA1 | BA2 | V | | | | |
| RD32 | BG/16B | H | H | L | H | C0 | C3 | C4 | C5 | RE |
| | BG | X | BA0 | BA1 | BG0 | BG1 | C1 | C2 | AP | FE |
| | 16B | | BA0 | BA1 | BA2 | BA3 | | | | |

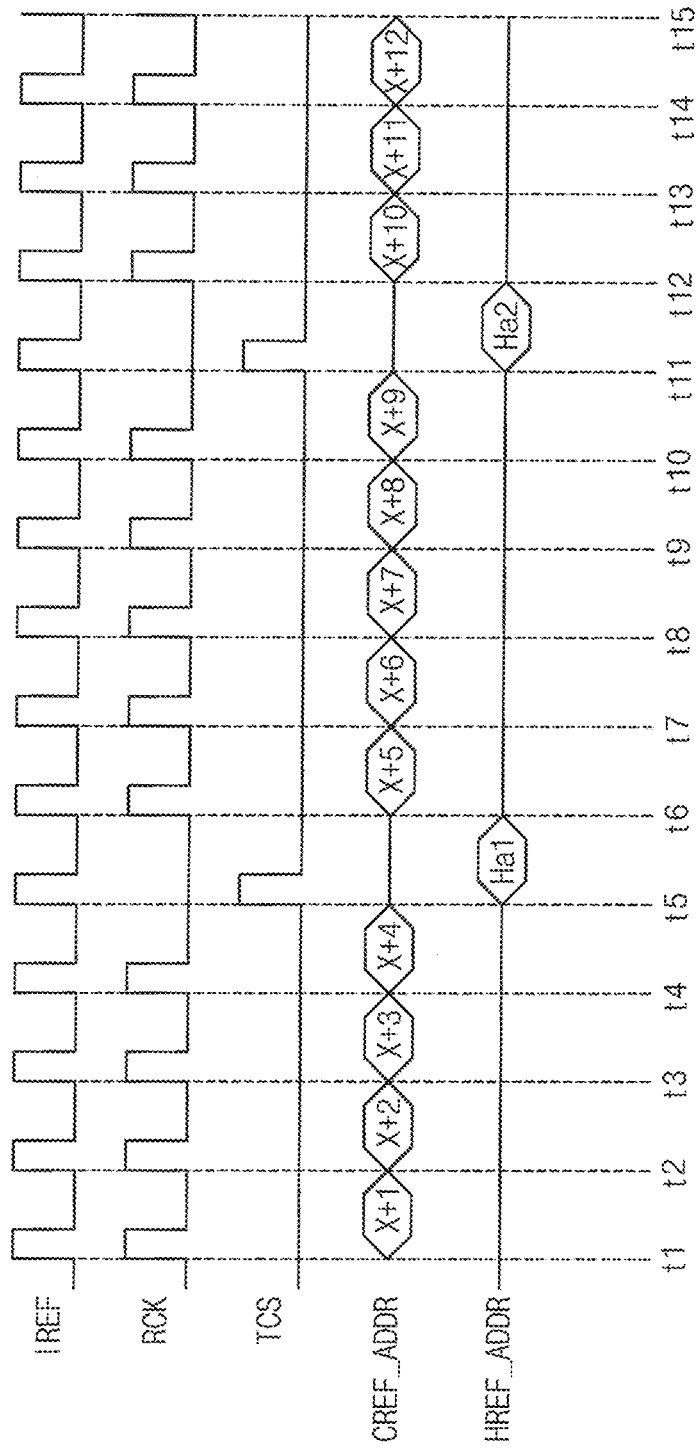

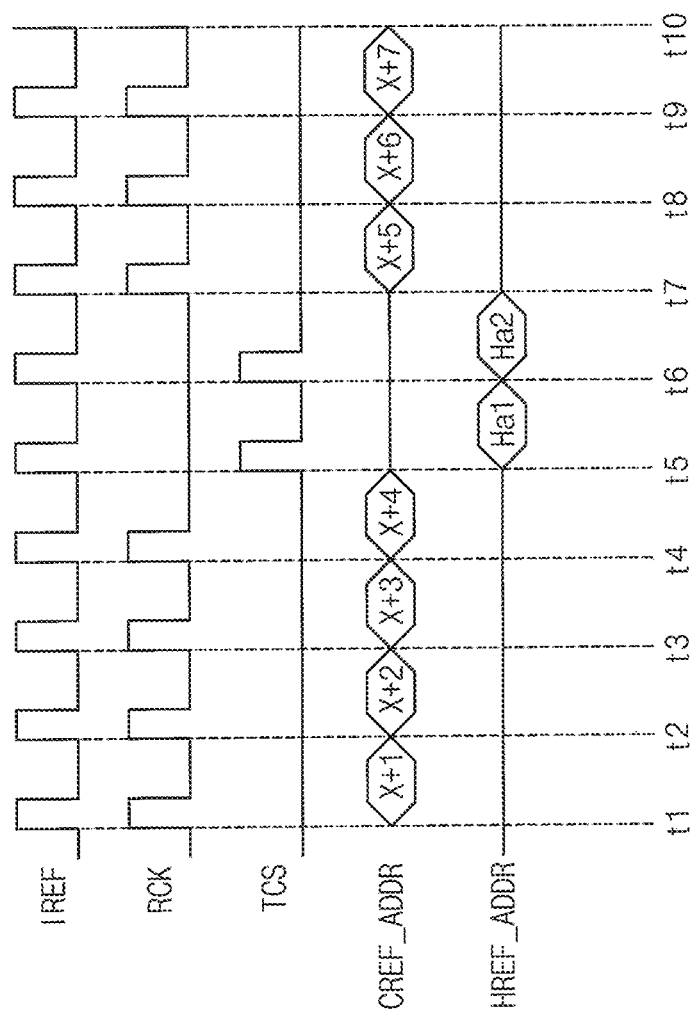

MEMORY CONTROLLER THAT TRANSMITS HAMMER ADDRESSES WITH DIFFERENT COMMAND PROTOCOLS AND MEMORY SYSTEM INCLUDING THE SAME

CROSS-REFERENCE TO RELATED APPLICATIONS

This application claims the benefit of priority under 35 USC § 119 to Korean Patent Application No. 10-2021-0114407, filed on Aug. 30, 2021, in the Korean Intellectual Property Office, the disclosure of which is incorporated by reference in its entirety herein.

BACKGROUND

The present disclosure relates to memories, and more particularly to memory controllers to detect hammer event memory systems including the same.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (e.g., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Example embodiments may provide a memory controller to control a semiconductor memory device, capable of more efficiently performing a hammer refresh operation on a memory cell row that is intensively accessed.

Example embodiments may provide a memory system capable of more efficiently performing a hammer refresh operation.

According to example embodiments, a memory controller to control a semiconductor memory device, includes a row hammer management circuit and a scheduler. The row hammer management circuit counts each of access addresses associated with accesses to a plurality of memory cell rows of the semiconductor memory device to store counting values therein and determines a hammer address associated with at least one memory cell row which is intensively accessed among from the plurality of memory cell rows and a type of the hammer address associated with an urgency of management of the hammer address based on the counting values. The scheduler transmits the hammer address to the semiconductor memory device according to a different command protocol based on the type of the hammer address.

According to example embodiments, a memory system includes a semiconductor memory device and a memory controller. The semiconductor memory device includes a memory cell array that includes a plurality of memory cell rows and each of the plurality of memory cell rows includes a plurality of volatile memory cells. The memory controller counts each of access addresses associated with accesses to the plurality of memory cell rows, determines a hammer address associated with at least one memory cell row which is intensively accessed among from the plurality of memory cell rows and a type of the hammer address associated with an urgency of management of the hammer address based on the counting and transmits the hammer address to the semiconductor memory device according to a different command protocol based on the type of the hammer address.

According to example embodiments, a memory system includes a semiconductor memory device and a memory controller. The semiconductor memory device includes a memory cell array that includes a plurality of memory cell rows and each of the plurality of memory cell rows includes a plurality of volatile memory cells. The memory controller counts each of access addresses associated with accesses to the plurality of memory cell rows, determines a hammer address associated with at least one memory cell row which is intensively accessed among from the plurality of memory cell rows and a type of the hammer address associated with an urgency of management of the hammer address based on the counting and transmits the hammer address to the semiconductor memory device according to a different command protocol based on the type of the hammer address. The memory controller includes a row hammer management circuit and a scheduler. The row hammer management circuit counts each of the access addresses to store counting values therein and determines the hammer address and the type of the hammer address based on the counting values. The semiconductor memory device further includes a refresh control circuit. The refresh control circuit generates hammer refresh address designating addresses of victim memory cell rows physically adjacent to a memory cell row corresponding to the hammer address based on the hammer address.

Accordingly, the memory controller applies the direct refresh management command to the semiconductor memory device in response to the second type of hammer address such that the semiconductor memory device performs the hammer refresh operation on the victim memory cell rows immediately and the memory controller applies the refresh command instead of the direct refresh management command to the semiconductor memory device in response to the first type of hammer address such that the semiconductor memory device performs the hammer refresh operation on the victim memory cell rows within a refresh interval. Therefore, the memory system may not degrade performance and may not violate command scheduling.

BRIEF DESCRIPTION OF THE DRAWINGS

Example embodiments will be described below in more detail with reference to the accompanying drawings.

FIGS. 14 through 17 illustrate example commands which may be used in the memory system of FIG. 1.

FIGS. 22A and 22B illustrate example operations of the refresh control circuit 400 in response to the first type of hammer address.

DETAILED DESCRIPTION

Various example embodiments will be described more fully hereinafter with reference to the accompanying drawings, in which example embodiments are shown.

Figure 1:
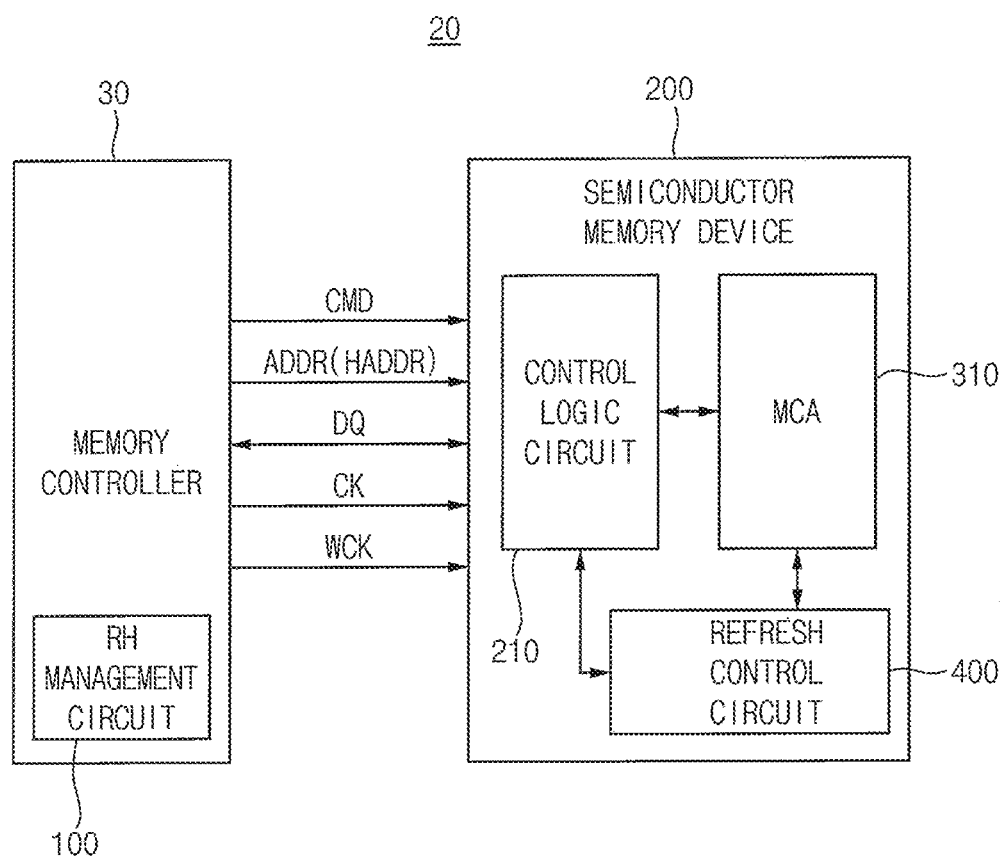
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and/or a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR4) synchronous DRAM (SDRAM), or a low power DDR5 (LPDDR5) SDRAM.

The memory controller 30 transmits a clock signal CK (the clock signal CK may be referred to a command clock signal), a command CMD, and/or an address (signal) ADDR to the semiconductor memory device 200. The memory controller 30 may transmit a data clock signal WCK to the semiconductor memory device 200 when the memory controller 30 writes a data signal DQ in the semiconductor memory device 200 or reads a data signal DQ from the semiconductor memory device 200.

The memory controller 30 may include a row hammer (RH) management circuit 100 that detects a hammer address HADDR associated with a memory cell row which is intensively accessed among from a plurality of memory cell rows of the semiconductor memory device 200 and may transmit the hammer address HADDR to the semiconductor memory device 200. The memory controller 30 may transmit the hammer address HADDR to the semiconductor memory device 200 according to a different command protocol based on an urgency of management of the hammer address. The address ADDR may be accompanied by the command CMD and the address ADDR may be referred to as an access address.

The semiconductor memory device 200 includes a memory cell array 310 that stores the data signal DQ, a control logic circuit 210 and/or a refresh control circuit 400.

The control logic circuit 210 may control operations of the semiconductor memory device 200. The refresh control circuit 400 may receive the hammer address HADDR and may perform a hammer refresh operation on victim memory cell rows physically adjacent to a memory cell row corresponding to the hammer address HADDR. The refresh control circuit 400 may control (or perform) a refresh operation on the plurality of memory cell rows in the memory cell array 310.

The semiconductor memory device 200 performs the refresh operation periodically due to charge leakage of memory cells storing data. Due to scale down of the manufacturing process of the semiconductor memory device 200, the storage capacitance of the memory cell may be decreased and/or the refresh period may be shortened. The refresh period may be further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme has been developed to reduce the burden of the memory controller. The memory controller is totally responsible for the hammer refresh operation in the TRR scheme and the semiconductor memory device is totally responsible for the hammer refresh operation in the in-memory refresh scheme.

The chip size overhead for the in-memory refresh may be significant as the memory capacity is increased and/or demands on lower power consumption of the semiconductor memory device is increased. In addition, the power consumption may be increased because the semiconductor memory device has to account for the hammer refresh operation even though there is no intensive access.

The memory system 20 according to example embodiments may perform the hammer address detection and the refresh execution in the memory controller 30 and the semiconductor memory device 200 to distribute the burden of the hammer refresh operation, thereby reducing a size of the semiconductor memory device 200 and enhancing overall performance of the memory system 20.

Figure 2:
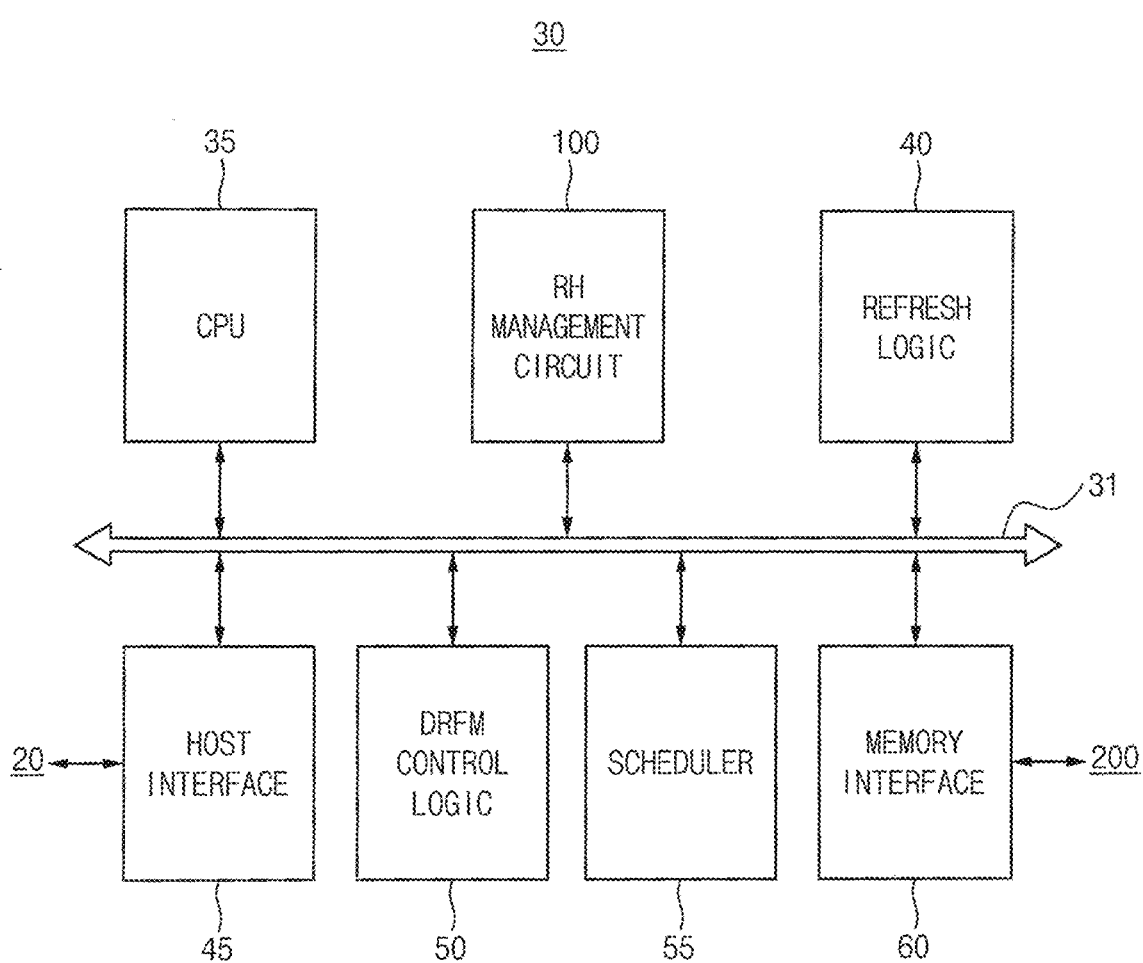
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a central processing unit (CPU) 35, the row hammer management circuit 100, a refresh logic 40, a host interface 45, a direct refresh management (DRFM) control logic 50, a scheduler 55 and/or a memory interface 60 which are connected to each other through a bus 31.

The CPU 35 may control overall operation of the memory controller 30. The CPU 35 may control the row hammer management circuit 100, the refresh logic 40, the host interface 45, the DRFM control logic 50, the scheduler 55 and the memory interface 60.

The row hammer management circuit 100 may count each of access addresses associated with accesses to the plurality of memory cell rows to store counting values therein and may determine a hammer address and a type of the hammer address based on the counting values. The hammer address may be associated with at least one memory cell row which is intensively accessed among from the plurality of memory cell rows and the type of the hammer address may be associated with an urgency of management of the hammer address.

The refresh logic 40 may generate auto refresh command for refreshing the plurality of memory cell rows based on a refresh interval of the semiconductor memory device 200.

The host interface 45 may perform interfacing with a host. The DRFM control logic 50 may generate a DRFM command based on the type of hammer address determined by the row hammer management circuit 100.

The scheduler 55 may manage scheduling and transmission of sequences of commands generated in the memory controller 30. The scheduler 55 may transmit the hammer address to the semiconductor memory device 200 via the memory interface 60 according to the different command protocol based on an urgency of management of the hammer address.

The memory interface 60 may perform interfacing with the semiconductor memory device 200.

Figure 3:
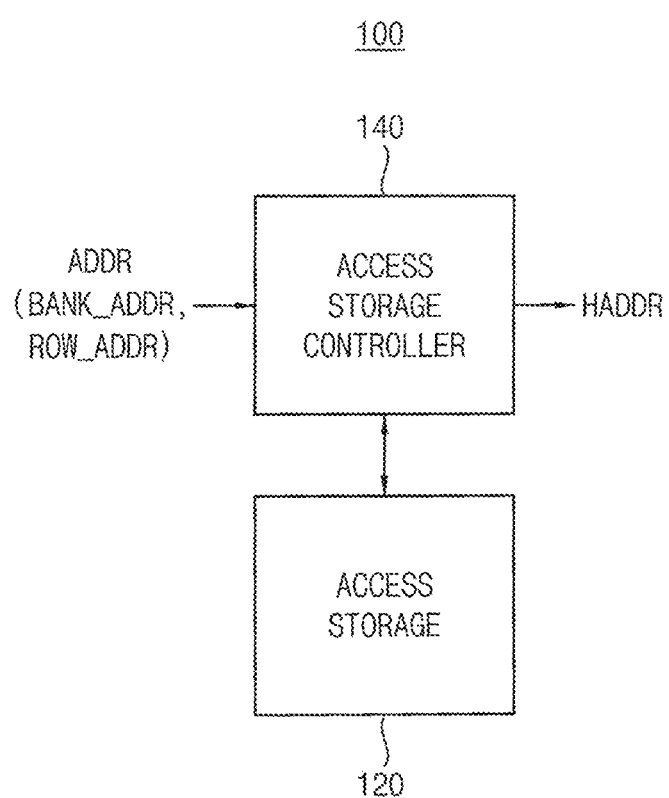
FIG. 3 is a block diagram illustrating an example of the row hammer management circuit in the memory controller in FIG. 2.
Figure 4:
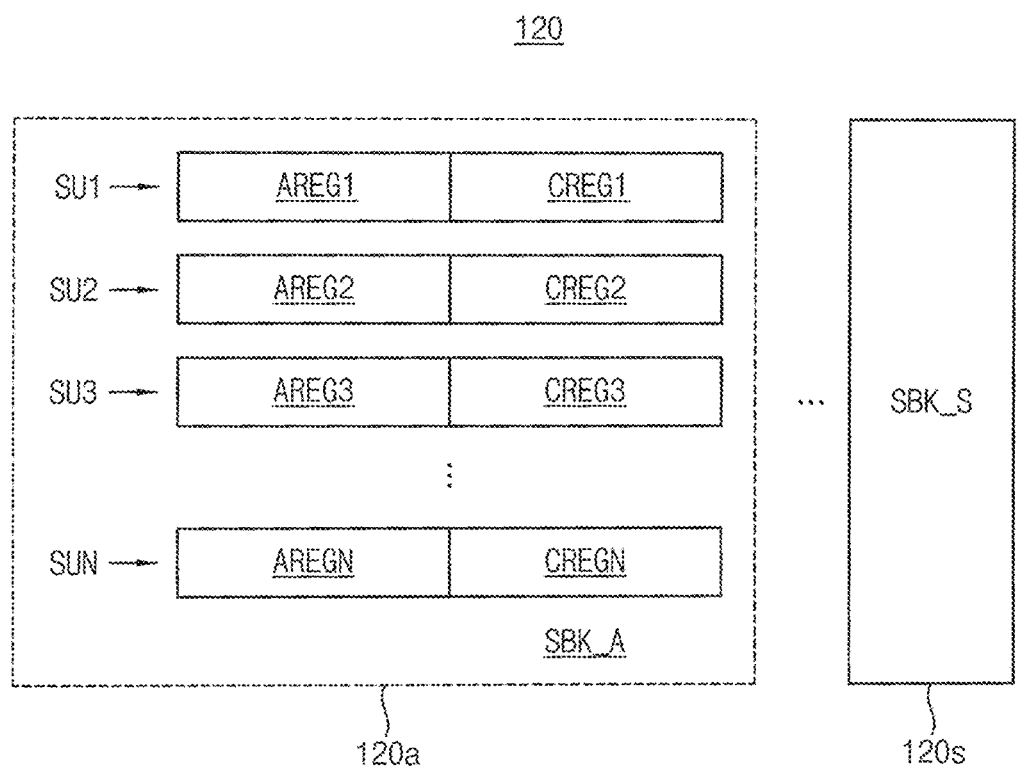
FIG. 4 is a diagram illustrating an example of an access storage included in the row hammer management circuit of FIG. 3 according to example embodiments.

FIG. 3 is a block diagram illustrating an example of the row hammer management circuit in the memory controller in FIG. 2, and FIG. 4 is a diagram illustrating an example of an access storage included in the row hammer management circuit of FIG. 3 according to example embodiments.

Referring to FIG. 3, the row hammer management circuit 100 may include an access storage 120 and/or an access storage controller 140.

The access storage 120 may store information on the hammer address HADD that is accessed intensively or frequently. In example embodiments, the access storage 120 may include a plurality of storage blocks SBK_A~SBK_S 120a~120s, and each of the storage blocks 120a~120s may include a plurality of storage units SU1~SUN as illustrated in FIG. 4. Here, s is an integer greater than two, and N is an integer greater than three. The storage blocks 120a~120s may have the same configuration and thus the one storage block 120a is described.

The storage units SU1~SUN may include address registers AREG1~AREGN storing the row addresses that are accessed and count registers CREG1~CREGN storing access counting values corresponding to the row addresses.

The access storage controller 140 may control the access storage 120 based on the access address ADDR that is transferred from the memory controller 30 to the memory device 200. The access address ADDR may include a bank address BANK_ADDR and a row address ROW_ADDR. The access storage controller 120 may determine and provide the hammer address HADDR among the stored access addresses based on the access counting values and a type of the hammer address HADDR based on the emergency of the management of the hammer address HADDR and may provide the scheduler 55 with the hammer address HADDR and the type of the hammer address HADDR.

Figure 5:
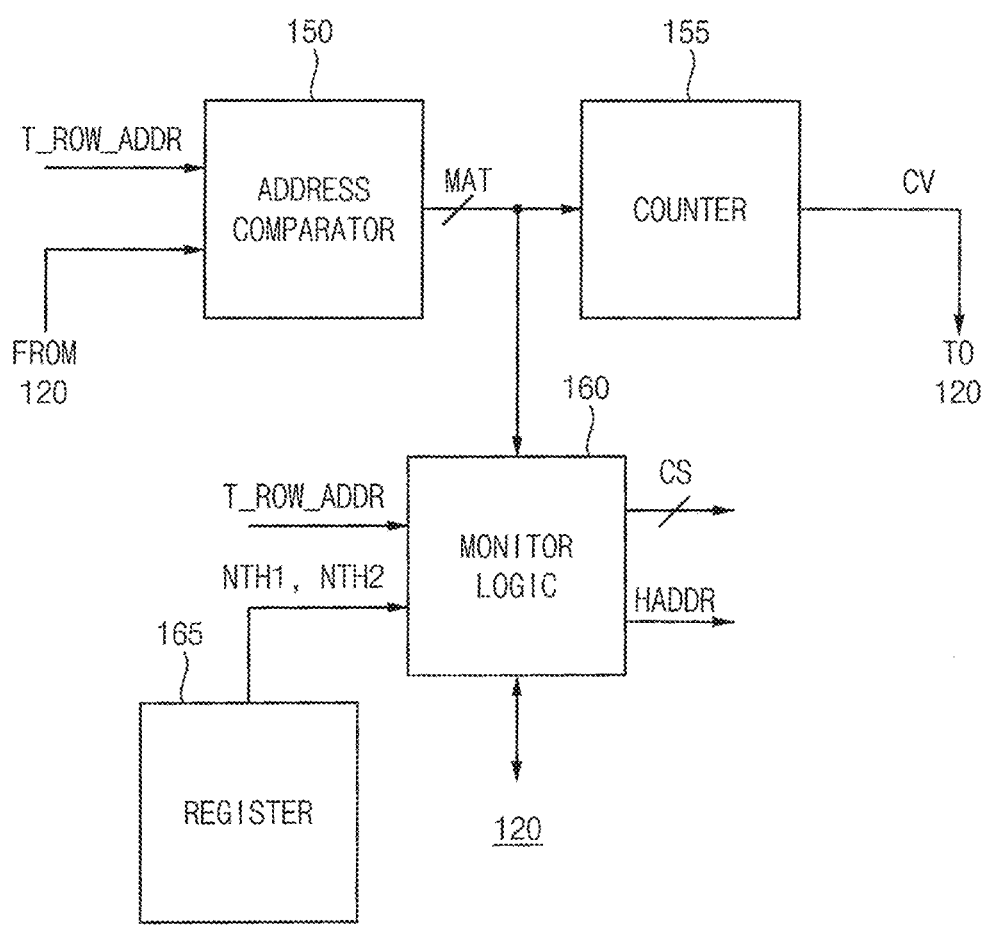
FIG. 5 is a block diagram illustrating an example of the access storage controller in FIG. 4 according to example embodiments.

FIG. 5 is a block diagram illustrating an example of the access storage controller in FIG. 4 according to example embodiments.

Referring to FIG. 5, the access storage controller 140 may include an address comparator 150, a counter 155, a monitor logic 160 and/or a register 165.

The address comparator 150 may compare a target row address T_ROW_ADDR of a target access address with a respective one of (previous) row addresses stored in the access storage 120 to generate matching signal MAT indicating whether the target row address T_ROW_ADDR matches a respective one of the previous row addresses. The target access address designates a memory cell row which is currently accessed among from the plurality of memory cell rows. The address comparator 150 may provide the matching signal MAT to the monitor logic 160 and the counter 155. The matching signal MAT may include a plurality of bits and one of the plurality of bits may have a logic high level when the target row address T_ROW_ADDR matches one of the previous row addresses.

The counter 155 may increase a counting value (e.g., access counting value) CV corresponding to the target row address T_ROW_ADDR in the access storage 120 in response to one of the plurality of bits in matching signal MAT having a non-zero value.

The register 165 may store a first reference number NTH1 and a second reference number NTH2 and may provide the first reference number NTH1 and the second reference number NTH2 to the monitor logic 160. The second reference number NTH2 may be greater than the first reference number NTH1. The first reference number NTH1 and the second reference number NTH2 may be variable.

The monitor logic 160 may be connected to the access storage 120, in response to one of the plurality of bits in matching signal MAT having a non-zero value, may compare a counting value CV of the target row address T_ROW_ADDR, which is stored in the access storage 120, with the first reference number NTH1 and the second reference number NTH2, may determine whether the target row address T_ROW_ADDR corresponds to the hammer address based on the comparison, and may provide the scheduler 55 with the hammer address HADDR and a comparison signal CS indicating the type of the hammer address HADDR in response to the target row address T_ROW_ADDR corresponding to the hammer address.

When the counting value of the target row address T_ROW_ADDR is smaller than the first reference number NTH1, the monitor logic 160 may provide the scheduler 55 with the comparison signal CS of '00' and may not provide the hammer address HADDR to the scheduler 55.

In response to the counting value of the target row address T_ROW_ADDR being equal to or greater than first reference number NTH1 and smaller than the second reference number NTH2, the monitor logic 160 may provide the scheduler 55 with the comparison signal CS of '01' and may provide the hammer address HADDR to the scheduler 55. The scheduler 55 may determine the type of the hammer address HADDR as a first type in response to the comparison signal CS of '01' and may transmit a first type of hammer address to the semiconductor memory device 200 according to a first command protocol. That is, the scheduler 55 may notify the semiconductor memory device 200 of the target row address T_ROW_ADDR corresponding to the first type of hammer address according to the first command protocol.

In response to the counting value of the target row address T_ROW_ADDR being equal to or greater than the second reference number NTH2, the monitor logic 160 may provide the scheduler 55 with the comparison signal CS of '10' and may provide the hammer address HADDR to the scheduler 55. The scheduler 55 may determine the type of the hammer address HADDR as a second type in response to the comparison signal CS of '10' and may transmit a second type of hammer address to the semiconductor memory device 200 according to a second command protocol different from the first command protocol. That is, the scheduler 55 may notify the semiconductor memory device 200 of the target row address T_ROW_ADDR corresponding to the second type of hammer address according to the second command protocol.

The monitor logic 160, in response to the plurality of bits in matching signal MAT having zero values, may store the target row address T_ROW_ADDR in the access storage 120 and increase the counting value of the target row address T_ROW_ADDR to 'one'.

Although one counter 155 is illustrated in FIG. 5, counters corresponding to a number of the memory cell rows may be included in the access storage controller 140.

Figure 6:
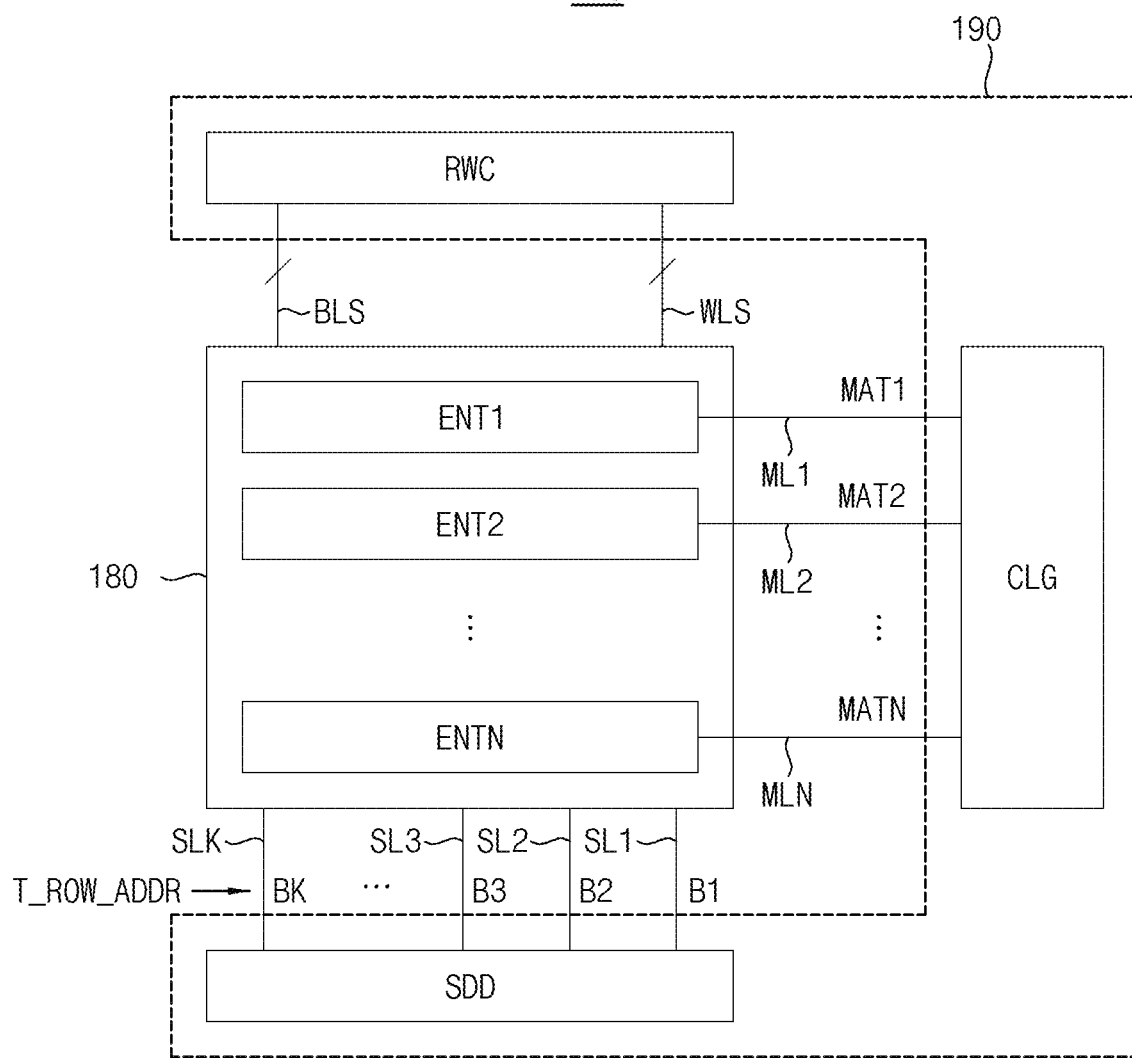
FIG. 6 is a block diagram illustrating a search circuit that may be included in the row hammer management circuit of FIG. 3 according to example embodiments.

FIG. 6 is a block diagram illustrating a search circuit that may be included in the row hammer management circuit of FIG. 3 according to example embodiments.

Referring to FIG. 6, a search circuit 170 may include a content-addressable memory (CAM) 180 and/or a CAM controller 190. The search circuit 170 may correspond to the access storage 120 in FIG. 3 and the address comparator 150 in FIG. 5.

The CAM 180 may store a plurality of entry data ENT1~ENTN. As will be described with reference to FIG. 7, the CAM 170 may include a plurality of CAM cells configured to store the plurality of entry data ENT1~ENTN, where each entry data includes a first bit corresponding to a least significant bit through a K-th bit corresponding to a most significant bit. The plurality of entry data ENT1~ENTN may store information on the hammer address HADD that is accessed intensively or frequently.

The CAM 180 may receive the target row address T_ROW_ADDR from the CAM controller 190 and may provide a plurality of matching signals MAT1~MATN indicating whether each of the plurality of entry data ENT1~ENTN matches the target row address T_ROW_ADDR.

The CAM controller 190 may search for target entry data among the plurality of entry data ENT1~ENTN based on the plurality of matching signals MAT1~MATN. The CAM controller 190 may perform a partial searching operation for searching for the target entry data. The partial searching operation may indicate that the CAM controller 190 applies comparison bits corresponding to a portion of the first through K-th bits B1~BK as the target row address T_ROW_ADDR to the CAM 180 and determines whether the bits of the plurality of entry data ENT1~ENTN corresponding to the comparison bits match the comparison bits. The CAM controller 190 may output the searched target entry data as the hammer address HADDR.

The CAM controller 190 may include a searching data driver SDD, a read-write circuit RWC and/or a control logic CLG.

The read-write circuit RWC may be connected to the CAM 180 through a plurality of bit-lines BLS and a plurality of word-lines WLS to write the entry data to the CAM 180 or read the entry data stored in the CAM 180. The CAM cells included in the CAM 180 may have various configurations and the read-write circuit RWC may have various configurations suitable for a configuration of the CAM cells.

The control logic CLG may control the partial searching operation. The control logic CLG may determine comparison bits based on the target entry data to be searched for, and provide the target row address T_ROW_ADDR including the comparison bits to the searching data driver SDD. The control logic CLG may be connected to the CAM 180 through a plurality of matching lines ML1~MLN. The control logic CLG may search for the target entry data among the plurality of entry data ENT1~ENTN based on the plurality of matching signals MAT1~MATN provided through the plurality of matching lines ML1~MLN.

The searching data driver SDD may be connected to the CAM 180 through a plurality of searching lines SL1~SLK. The searching data driver SDD may latch the target row address T_ROW_ADDR provided from the control logic CLG and apply the target row address T_ROW_ADDR to the CAM 180 through the plurality of searching lines SL1~SLK.

Using the partial searching operation, the target entry data satisfying various conditions may be searched for among the plurality of entry data ENT1~ENTN stored in the CAM 180. The CAM controller 190 may repeat the partial searching operation with changing the comparison bits until the target entry data are determined. In this disclosure, "searching for the target entry data" may include "determining a target position of the CAM 180 in which the target entry data are stored". The target position may be represented by various forms such and an address, a pointer, and so on. The information on the target position may be provided to the read-write circuit RWC and the read-write circuit RWC may read out the target entry data from the CAM 180 based on the target position.

In example embodiments, the CAM controller 190 may repeat the partial searching operation with increasing a number of the comparison bits one by one in a direction from the K-th bit BK to the first bit B1.

As such, the search circuit according to example embodiments may replace various circuits such as comparators for applying various conditions and sizes of the various circuits may be reduced by searching for data of a particular condition, using the CAM.

Figure 7:
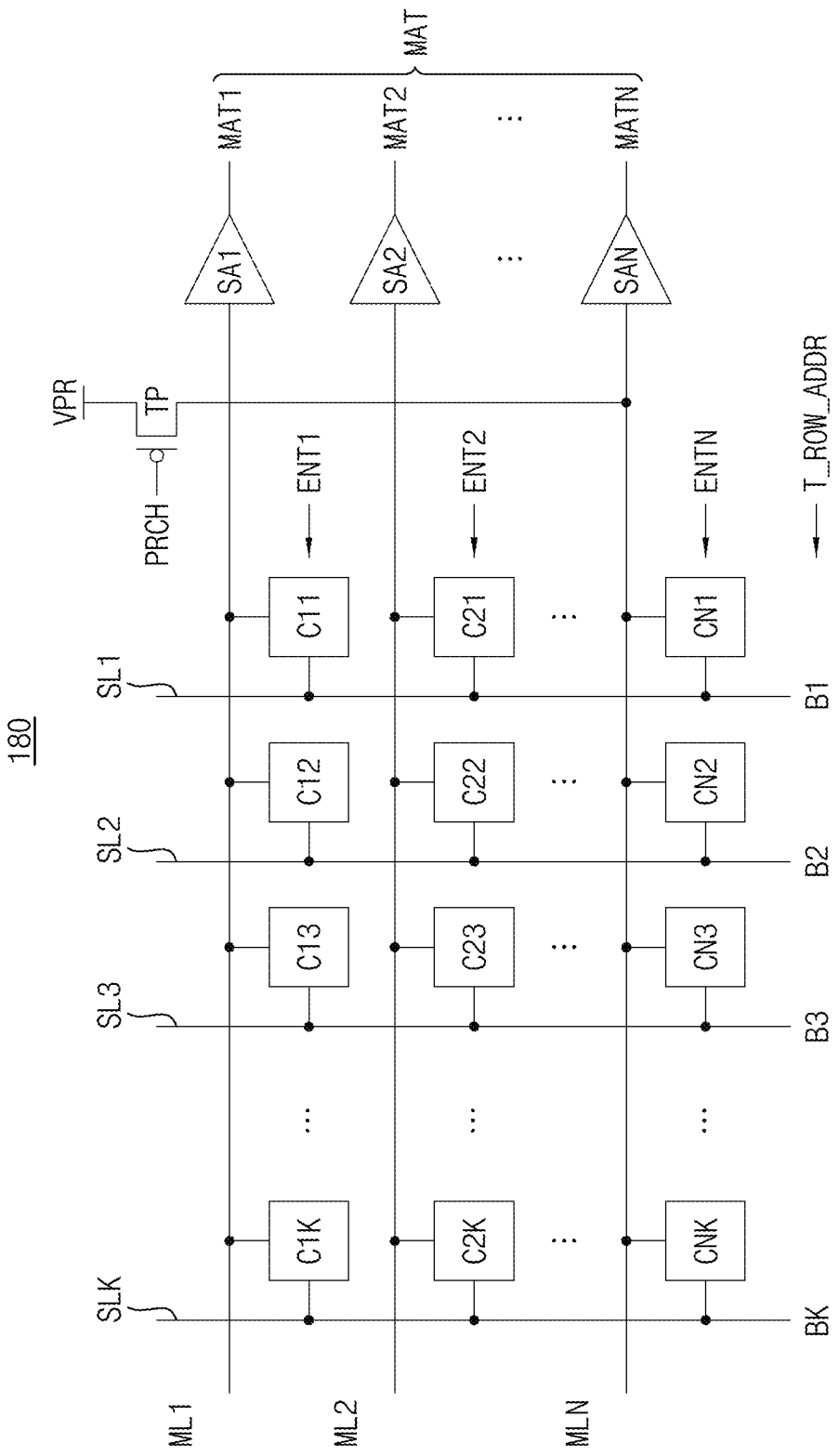
FIG. 7 is a diagram illustrating a schematic configuration of a content-addressable memory included in the search circuit of FIG. 6.

FIG. 7 is a diagram illustrating a schematic configuration of a content-addressable memory (CAM) included in the search circuit of FIG. 6.

Referring to FIG. 7, the CAM 180 may include a plurality of CAM cells C11~CNK, a precharge circuit TP and/or a plurality of sense amplifiers SA1~SAN.

The plurality of CAM cells C11~CNK may be arranged in a matrix form of N rows and K columns, and the K CAM cells corresponding to one row may store one entry data including a first bit B1 corresponding to a least significant bit through a K-th bit corresponding to a most significant bit BK. In other words, the CAM cells C11~C1K of the first row may store the first entry data ENT1 including the K bits, the CAM cells C21~C2K of the second row may store the first entry data ENT2 including the K bits, and as such, the CAM cells CN1~CNK of the N-th row may store the N-th entry data ENTN including the K bits.

The CAM cells of the same row may be commonly connected to the same matching line. In other words, the CAM cells C11~C1K of the first row may be commonly connected to the first matching line ML1, the CAM cells C21~C2K of the second row may be commonly connected to the second matching line ML2, and as such, the CAM cells CN1~CNK of the N-th row may be commonly connected to the N-th matching line MLN.

The CAM cells of the same column may be commonly connected to the same searching line. In other words, the CAM cells C11~CN1 of the first column may be commonly connected to the first searching line SL1, the CAM cells C12~CN2 of the second column may be commonly connected to the second searching line SL2, and as such, the CAM cells C1K~CNK of the K-th column may be commonly connected to the K-th searching line SLK.

The plurality of sense amplifiers SA1~SAN may sense and amplify voltages of the plurality of matching lines ML1~MLN to provide the plurality of matching signals MAT1~MATN. According to example embodiments, the sense amplifiers SA1~SAN may be omitted, or may be included in the control logic CLG in FIG. 6.

The precharge circuit TP may precharge the plurality of matching lines ML1~MLN with a precharge voltage VPR.

FIG. 7 illustrates a simplified configuration of the CAM 180. The target row address T_ROW_ADDR including the first through K-th bits B1~BK may be broadcast through the first through K-th searching lines SL1~SLK, and the comparison results between the plurality of entry data ENT1~ENTN and the searching data SDT may be provided to the plurality of sense amplifiers SA1~SAN through the plurality of matching lines ML1~MLN.

As the comparison results, each matching signal MATi (i=1~N) may have a first logic level (for example, a logic high level) indicating a match case when the comparison bits of the target row address T_ROW_ADDR match the corresponding bits of each entry data ENTi, and each matching signal MATi may have a second logic level (for example, a logic low level) indicating a mismatch case when the comparison bits of the target row address T_ROW_ADDR does not match the corresponding bits of each entry data ENTi. In this disclosure, the logic high level may be equal to a value of 1 and the logic low level may be equal to a value of 0.

The search circuit 170 of FIG. 6 may replace the address registers AREG1~AREGN in FIG. 4 and the address comparator 150 in FIG. 5.

Figure 8:
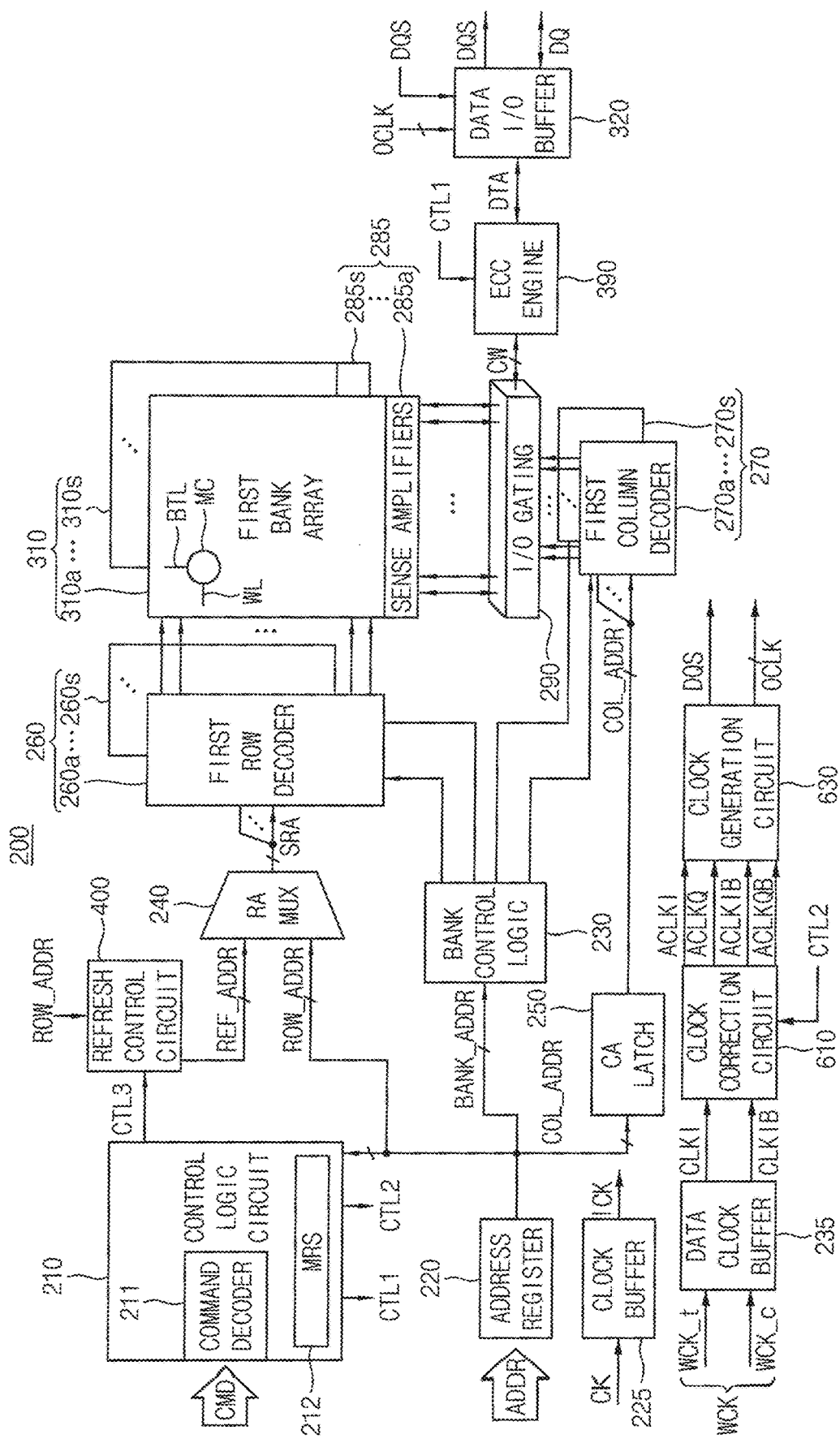
FIG. 8 is a block diagram illustrating the semiconductor memory device in FIG. 1 according to example embodiments.

FIG. 8 is a block diagram illustrating the semiconductor memory device in FIG. 1 according to example embodiments.

Referring to FIG. 8, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 390, a clock buffer 225, a data clock buffer 235, a clock correction circuit 610, a clock generation circuit 630 and/or a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to a third control signal CTL3 from the control logic circuit 210. The refresh control circuit 400 may determine the row address ROW_ADDR as the hammer address in a hammer refresh mode in response to the third control signal CTL3 from the control logic circuit 210, and may output hammer refresh row addresses designating memory cell rows adjacent to a memory cell row corresponding to the hammer address as the refresh row address REF_ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some example embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

Codeword CW read from one bank array of the first through sixteenth bank arrays 310a~310s is sensed by a sense amplifier coupled to the one bank array from which the data is to be read, and is stored in the read data latches. The codeword CW stored in the read data latches may be provided to the data I/O buffer 320 as data DTA after ECC decoding is performed on the codeword CW by the ECC engine 390. The data I/O buffer 320 may convert the data DTA into the data signal DQ based on output clock signals OCLK and may transmit the data signal DQ along with the strobe signal DQS to the memory controller 30.

The data signal DQ to be written in one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 390. The ECC engine 390 may perform an ECC encoding on the data DTA to generate parity bits, and the ECC engine 390 may provide the codeword CW including data DTA and the parity bits to the I/O gating circuit 290. The I/O gating circuit 290 may write the codeword CW in a sub-page in one bank array through the write drivers.

The data I/O buffer 320 may provide the data signal DQ from the memory controller 30 to the ECC engine 390 by converting the data signal DQ to the data DTA in a write operation of the semiconductor memory device 200 and may convert the data DTA to the data signal DQ from the ECC engine 390 based on an output clock signals OCLK from the clock generation circuit 630, and may transmit the data signal DQ and the strobe signal DQS to the memory controller 30 in a read operation of the semiconductor memory device 200. The data I/O buffer 320 may output the data signal DQ to the outside based on the output clock signals OCLK in the read operation.

The ECC engine 390 may perform an ECC encoding and an ECC decoding on the data DTA based on a first control signal CTL1 from the control logic circuit 210.

The clock buffer 225 may receive the clock signal CLK, may generate an internal clock signal ICK by buffering the clock signal CLK, and may provide the internal clock signal ICK to circuit components processing the command CMD and the address ADDR.

The data clock buffer 235 may receive the data clock signal WCK including differential clock signal pair WCK_t and WCK_c, may generate a first clock signal CLKI and a second clock signal CLKIB which have a phase difference of 180 degrees with respect to each other, based on the data clock signal WCK and may provide the first clock signal CLKI and the second clock signal CLKIB to the clock correction circuit 610.

The clock correction circuit 610 may generate first through fourth divided clock signals which have a phase difference of 90 degrees with respect to each other based on the first clock signal CLKI and the second clock signal CLKIB, may generate first through fourth adjusted clock signals ACLKI, ACLKQ, ACLKIB and ACLKQB by adjusting skew of each of the first through fourth divided clock signals, and may provide the first through fourth adjusted clock signals ACLKI, ACLKQ, ACLKIB and ACLKQB to the clock generation circuit 630.

The clock generation circuit 630 may generate the output clock signal OCLK and the strobe signal DQS based on the first through fourth adjusted clock signals ACLKI, ACLKQ, ACLKIB and ACLKQB and may provide the output clock signal OCLK and the strobe signal DQS to the data I/O buffer 320.

The control logic circuit 210 may control operations of the semiconductor memory device 200. For example, the control logic circuit 210 may generate control signals for the semiconductor memory device 200 in order to perform a write operation, a read operation or a duty training operation. The control logic circuit 210 includes a command decoder 211 that decodes the command CMD received from the memory controller 100 and a mode register set (MRS) 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate the first control signal CTL1 to control the ECC engine 390, a second control signal CTL2 to control the clock correction circuit 610 and the third control signal CTL3 to control the refresh control circuit 400.

Figure 9:
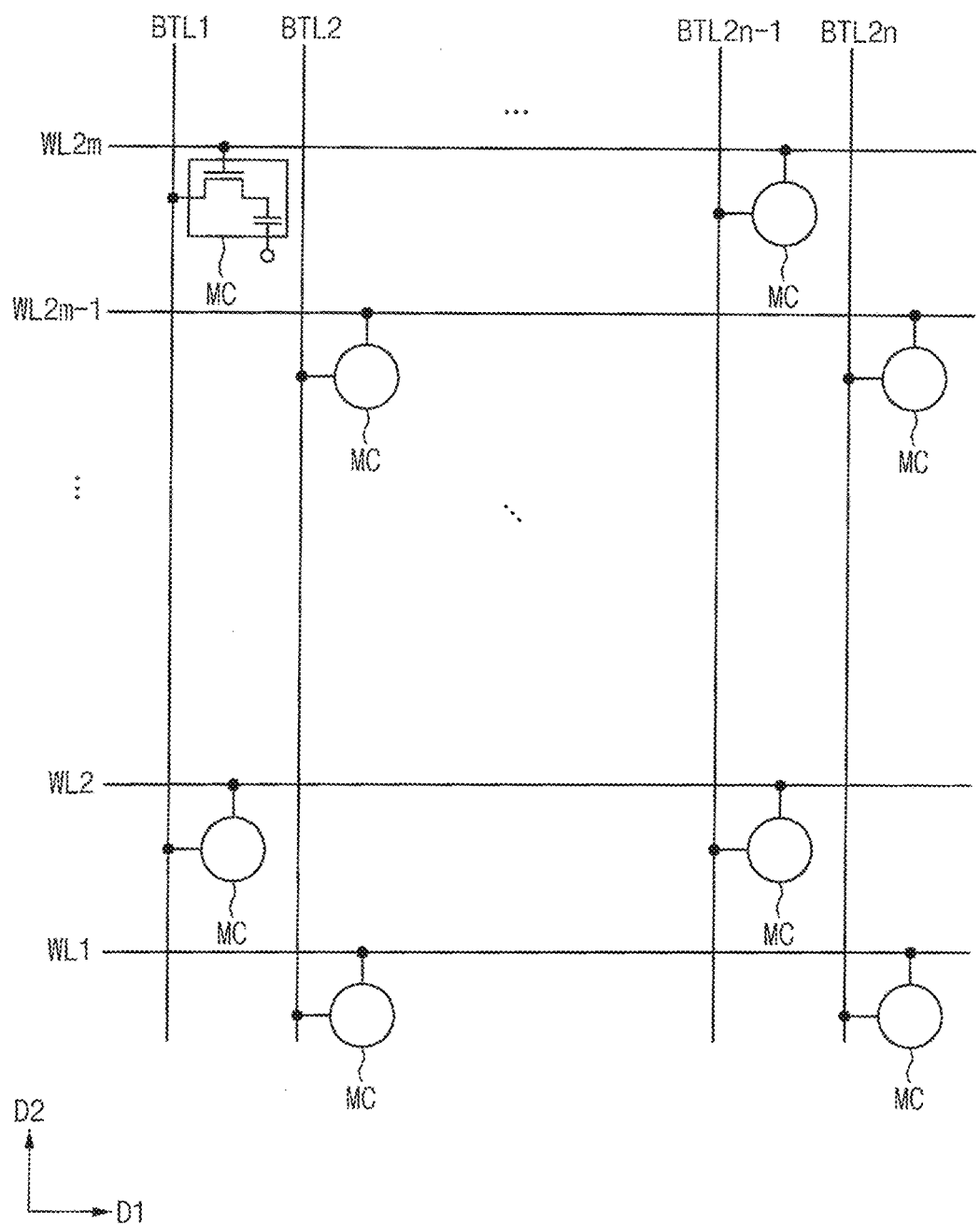
FIG. 9 illustrates an example of the first bank array in the semiconductor memory device of FIG. 8.

FIG. 9 illustrates an example of the first bank array in the semiconductor memory device of FIG. 8.

Referring to FIG. 9, the first bank array 310a includes a plurality of word-lines WL1~WL2m (m is a natural number greater than two), a plurality of bit-lines BTL1~BTL2n (n is a natural number greater than two), and a plurality of memory cells MCs disposed at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the a plurality of memory cells MCs may be referred to as rows of the first bank array 31a0 and the bit-lines BTL1~BTL2n coupled to the a plurality of memory cells MCs may be referred to as columns of the first bank array 310a.

Figure 10A:
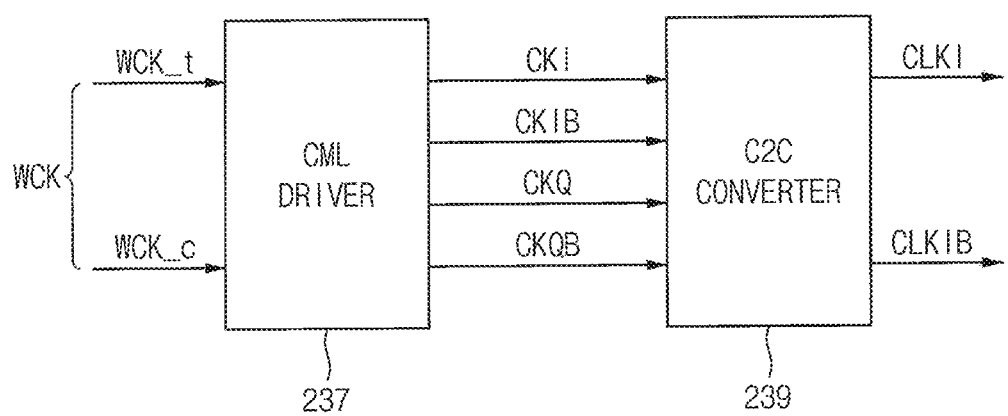
FIG. 10A is a block diagram illustrating an example of the data clock buffer in the semiconductor memory device of FIG. 8 according to example embodiments.

FIG. 10A is a block diagram illustrating an example of the data clock buffer in the semiconductor memory device of FIG. 8 according to example embodiments.

Referring to FIG. 10A, the data clock buffer 235 may include a current mode logic (CML) driver 237 and/or a CML to complementary metal-oxide semiconductor (CMOS) level (C2C) converter 239.

The CML driver 237 may drive the data clock signal WCK including differential clock signal pair WCK_t and WCK_c and have a CML level to generate internal clock signals CKI, CKQ, CKIB and CKQB which have a phase difference of 90 degrees with respect to one another and the C2C converter 239 may generate the first clock signal CLKI and the second clock signal CLKIB which have a phase difference of 180 degrees with respect to each other, based on the data clock signal WCK and have a CMOS level. The C2C converter 239 may provide the first clock signal CLKI and the second clock signal CLKIB to the clock correction circuit 610 in FIG. 8.

Figure 10B:
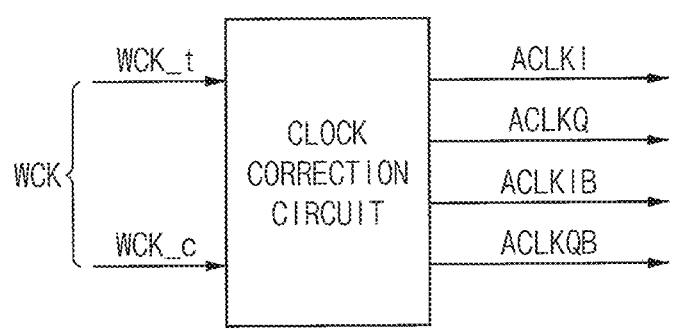
FIG. 10B illustrates that the clock correction circuit directly receives the data clock signal in the semiconductor memory device of FIG. 8 according to example embodiments.

FIG. 10B illustrates that the clock correction circuit directly receives the data clock signal in the semiconductor memory device of FIG. 8 according to example embodiments.

Referring to FIG. 10B, the data clock signal WCK including differential clock signal pair WCK_t and WCK_c may be directly input to the clock correction circuit 610. The differential clock signal WCK_t may be referred to as a first data clock signal, and the differential clock signal WCK_c may be referred to as a second data clock signal.

Figure 11:
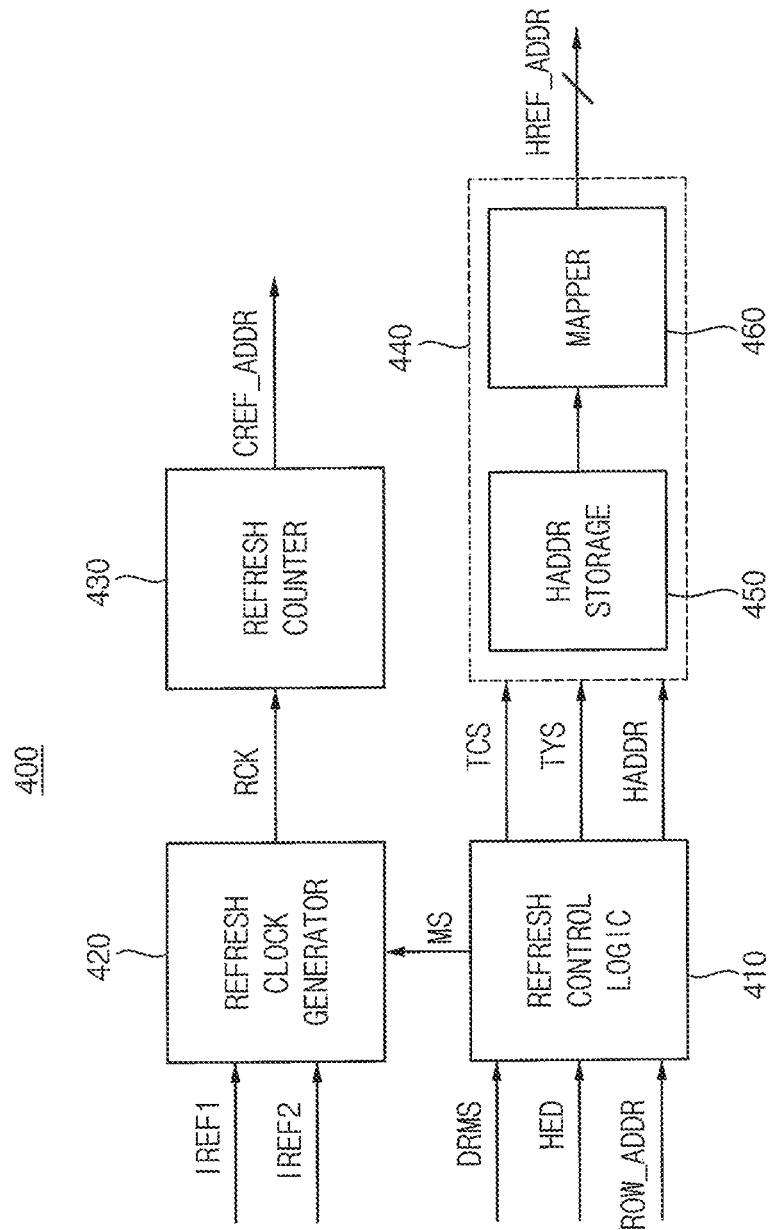
FIG. 11 is a block diagram illustrating an example of the refresh control circuit in FIG. 8 according to example embodiments.

FIG. 11 is a block diagram illustrating an example of the refresh control circuit in FIG. 8 according to example embodiments.

Referring to FIG. 11, the refresh control circuit 400 may include a refresh control logic 410, a refresh clock generator 420, a refresh counter 430 and/or a hammer refresh address generator 440.

The refresh control logic 410 may receive the row address ROW_ADDR of a memory cell row that is currently accessed, may store the row address ROW_ADDR temporarily, may provide the hammer refresh address generator 440 with the row address ROW_ADDR as the hammer address HADDR and may provide a mode signal MS to the refresh clock generator 420, in response to a row hammer event detection signal HED indicating that the row address ROW_ADDR corresponds to the hammer address HADDR.

In addition, when refresh control logic 410 receives a direct refresh management signal DRMS within a reference time interval from a time point at which the refresh control logic 410 receives the row hammer event detection signal HED, the refresh control logic 410 may provide the hammer refresh address generator 440 with a type signal TYS indicating that the hammer address HADDR corresponds to a second type of the hammer address. In addition, when refresh control logic 410 does not receive the direct refresh management signal DRMS within the reference time interval from the time point at which the refresh control logic 410 receives the row hammer event detection signal HED, the refresh control logic 410 may provide the hammer refresh address generator 440 with the type signal TYS indicating that the hammer address HADDR corresponds to a first type of the hammer address. In addition, the refresh control logic 410 may provide the hammer refresh address generator 440 with a timing control signal for controlling output timing of the hammer address based on the row hammer event detection signal HED and the direct refresh management signal DRMS.

The refresh clock generator 420 may generate a refresh clock signal RCK indicating a timing of a normal refresh operation based on a first refresh control signal IREF1, a second refresh control signal IREF2 and the mode signal MS. The refresh clock generator 420 may generate the refresh clock signal RCK in response to the receiving the first refresh control signal IREF1 or during the second refresh control signal IREF2 is activated.

When the command CMD from the memory controller 30 corresponds to an auto refresh command, the control logic circuit 210 in FIG. 8 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 420 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 8.

The hammer refresh address generator 440 may include a hammer address storage 450 and/or a mapper 460.

The hammer address storage 450 may store the hammer address HADDR and may output the hammer address HADDR to the mapper 460 in response to the timing control signal TCS. The mapper 460 may generate hammer refresh addresses HREF_ADDR designating victim memory cell rows physically adjacent to a memory cell row corresponding to the hammer address HADDR.

For example, in response to the type signal TYS indicating that the hammer address HADDR corresponds to the first type of hammer address, the mapper 460 may generate a first number of the hammer refresh addresses HREF_ADDR designating victim memory cell rows physically adjacent to the memory cell row corresponding to the hammer address HADDR. The first number may be two. For example, in response to the type signal TYS indicating that the hammer address HADDR corresponds to the second type of hammer address, the mapper 460 may generate a second number of the hammer refresh addresses HREF_ADDR designating victim memory cell rows physically adjacent to the memory cell row corresponding to the hammer address HADDR. The second number may be four.

The hammer refresh address generator 440 may provide the hammer refresh address HREF_ADDR as the refresh row address REF_ADDR to the row address multiplexer 240 in FIG. 8.

The hammer address storage 450 may have a configuration similar with a configuration of the access storage 120 in FIG. 4. The refresh control logic 410 may include a buffer to store the row address ROW_ADDR temporarily and a counter to count the hammer address HADDR.

Figure 12:
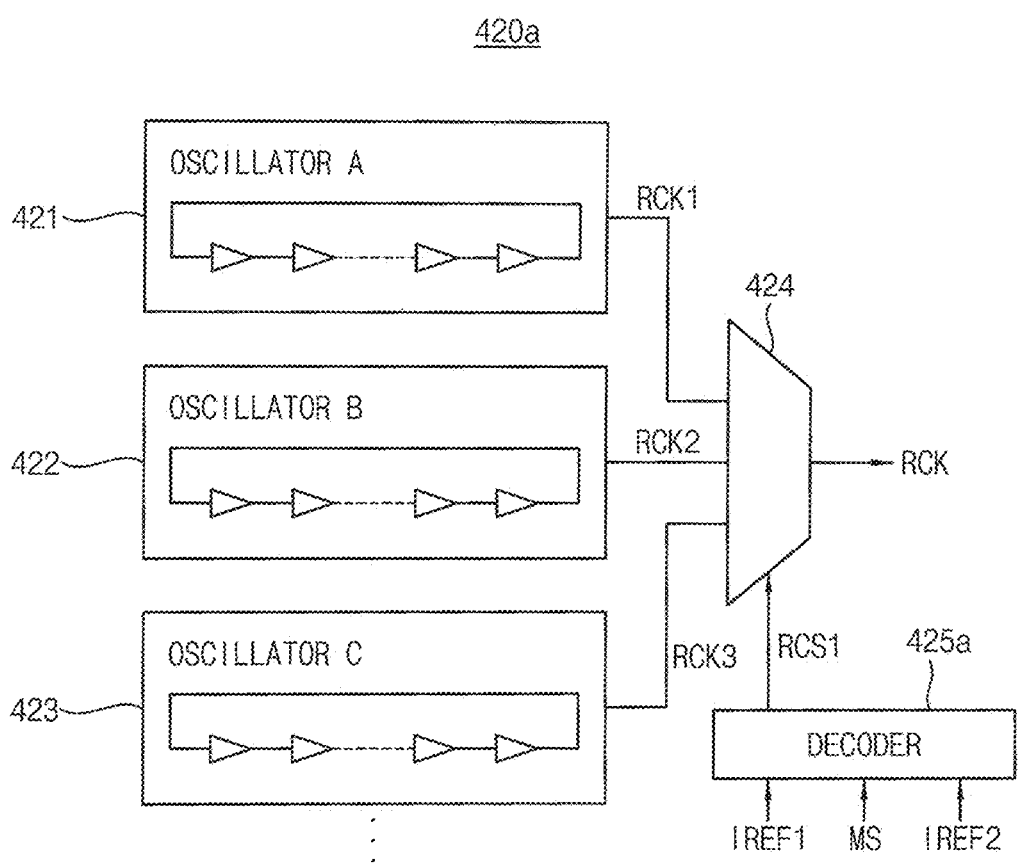
FIG. 12 is a circuit diagram illustrating an example of the refresh clock generator shown in FIG. 11 according to example embodiments.

FIG. 12 is a circuit diagram illustrating an example of the refresh clock generator shown in FIG. 11 according to example embodiments.

Referring to FIG. 12, a refresh clock generator 420a may include a plurality of oscillators 421, 422 and 423, a multiplexer 424 and/or a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

Figure 13:
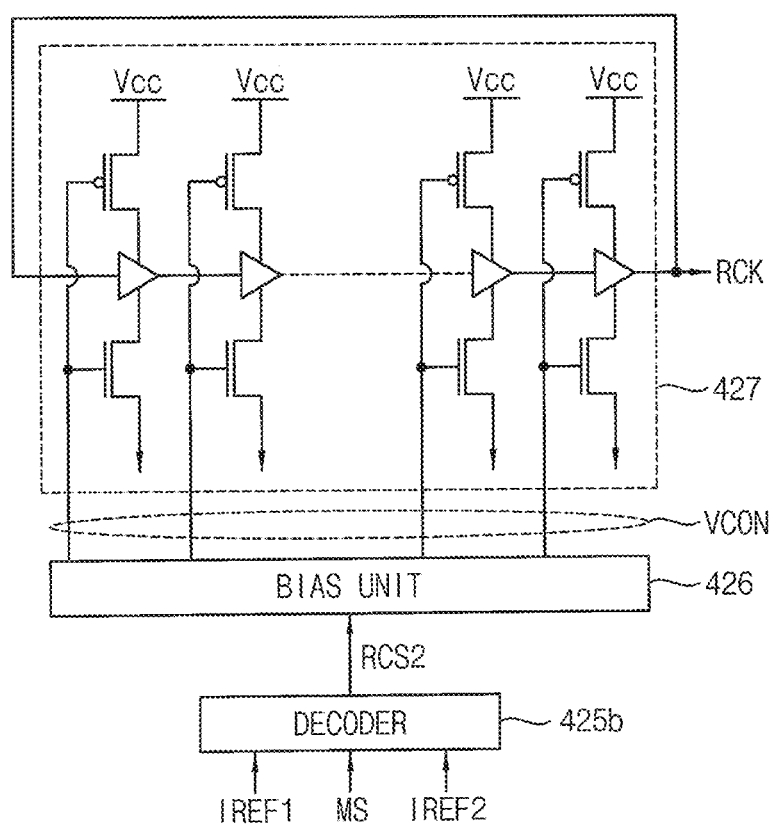
FIG. 13 is a circuit diagram illustrating another example of the refresh clock generator in FIG. 11 according to example embodiments.

FIG. 13 is a circuit diagram illustrating another example of the refresh clock generator in FIG. 11 according to example embodiments.

Referring to FIG. 13, a refresh clock generator 420b may include a decoder 425b, a bias unit 426 and/or an oscillator 427. The decoder 425b may decode the first refresh control signal IREF1, the second refresh control signal IREF2 and the mode signal MS to output a clock control signal RCS2. The bias unit 426 generates a control voltage VCON in response to the clock control signal RCS2. The oscillator 427 generates the refresh pulse signal RCK having a variable period, according to the control voltage VCON.

FIGS. 14 through 17 illustrate example commands which may be used in the memory system of FIG. 1.

FIG. 14 illustrates combinations of a chip selection signal CS and first through seventh command-address signals CA0~CA6 representing a first active command ACT1 and a second active command ACT2, FIG. 15 illustrates combinations of the chip selection signal CS and the first through seventh command-address signals CA0~CA6 representing a precharge command PRE and a refresh command REF, FIG. 16 illustrates combinations of the chip selection signal CS and the first through seventh command-address signals CA0~CA6 representing a 16 burst-length (BL) write command WR16, a write command WR and 32 BL write command WR32, and FIG. 17 illustrates combinations of the chip selection signal CS and the first through seventh command-address signals CA0~CA6 representing a 16 BL read command RD16, a read command RD and 32 BL read command RD32.

In FIGS. 14 through 17, H indicates the logic high level, L indicates the logic low level, X indicates non-definition of a logic level, R0~R17 indicate bits of a row address BG indicates a bank group mode, 16B indicates 16-bank mode, 8B indicates 8-bank mode, BA0~BA3 indicate bits of a bank address, BG0 and BG1 indicate bits of a bank group address, V indicates any one of the logic low level and the logic high level, RE indicates a rising edge of a clock signal CK and a FE indicates a falling edge of the clock signal CK. In addition, in FIGS. 16 and 17, C0~C5 indicate bits of a column address.

Referring to FIG. 14, the first active command ACT1 and the second active command ACT2 may be transferred during a plurality of clock cycles, for example, during the four clock cycles. The first active command ACT1 and the second active command ACT2 may include the bank address bits BA0~BA3 and the row address bits R0~R17.

Referring to FIG. 15, the memory system 20 may use the sixth command-address signal CA5 of the precharge command PRE as a hammer flag information by setting the sixth command-address signal CA5 of the precharge command PRE to a logic low level. The scheduler 55 in the memory controller 30 may notify the semiconductor memory device 200 of a row address including the row address bits R0~R17, accompanied by the first active command ACT1 and the second active command ACT2, corresponding to the hammer address by setting the sixth command-address signal CA5 of the precharge command PRE to a logic low level.

In addition, the fourth command-address signal CA3 of the precharge command PRE may be used as a refresh management (RFM) flag.

In FIG. 15, AB indicates all of the banks, and SB indicates same bank.

Referring to FIG. 16, the seventh command-address signal CA6 of each of the write commands WR, WR16 and WR32 includes auto precharge information AP, the scheduler 55 in the memory controller 30 may notify the semiconductor memory device 200 of a row address including the row address bits R0~R17, accompanied by the first active command ACT1 and the second active command ACT2, corresponding to the hammer address by using the auto precharge information AP.

Referring to FIG. 17, the seventh command-address signal CA6 of each of the read commands RD, RD16 and RD32 includes auto precharge information AP, the scheduler 55 in the memory controller 30 may notify the semiconductor memory device 200 of a row address including the row address bits R0~R17, accompanied by the first active command ACT1 and the second active command ACT2, corresponding to the hammer address by using the auto precharge information AP.

Figure 18:
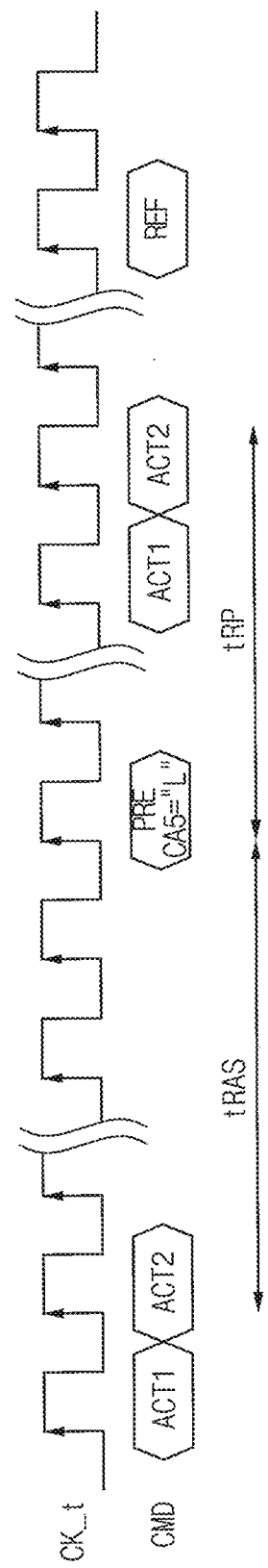
FIG. 18 illustrates an example of the first command protocol which the memory controller uses in response to a first type of hammer address.

FIG. 18 illustrates an example of the first command protocol which the memory controller uses in response to a first type of hammer address.

Referring to FIGS. 2, 5 and 18, in response to the target row address T_ROW_ADDR corresponding to the first type of hammer address, the scheduler 55 consecutively applies the first active command ACT1 and the second active command ACT2 to the semiconductor memory device 200 in synchronization with an edge of the clock signal CK_t, and applies the precharge command PRE notifying that the target row address T_ROW_ADDR corresponds to the hammer address to the semiconductor memory device 200 after a tRAS corresponding to active to precharge time elapses. In some example embodiments, the scheduler 55 may set the sixth command-address signal CA5 of the precharge command PRE to a logic low level.

After a time interval corresponding to precharge time tRP, the scheduler 55 consecutively applies the first active command ACT1 and the second active command ACT2 to the semiconductor memory device 200 in synchronization with an edge of the clock signal CK_t and applies a refresh command REF to the semiconductor memory device 200. The semiconductor memory device 200 performs a hammer refresh operation on two victim memory cell rows physically adjacent to a memory cell row corresponding to the hammer address HADDR, in response to the refresh command REF.

Figure 19:
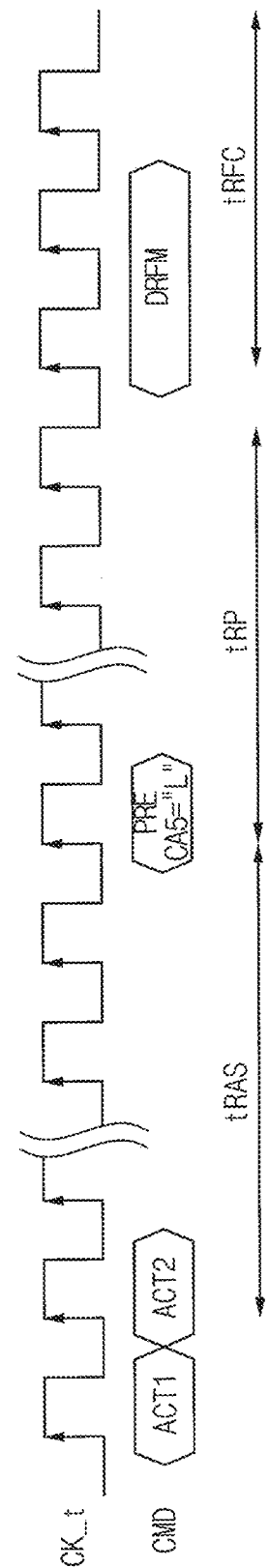
FIG. 19 illustrates an example of the first command protocol which the memory controller uses in response to a second type of hammer address.

FIG. 19 illustrates an example of the first command protocol which the memory controller uses in response to a second type of hammer address.

Referring to FIGS. 2, 5 and 19, in response to the target row address T_ROW_ADDR corresponding to the second type of hammer address, the scheduler 55 consecutively applies the first active command ACT1 and the second active command ACT2 to the semiconductor memory device 200 in synchronization with an edge of the clock signal CK_t, and applies the precharge command PRE notifying that the target row address T_ROW_ADDR corresponds to the hammer address to the semiconductor memory device 200 after a tRAS corresponding to active to precharge time elapses. In some example embodiments, the scheduler 55 may set the sixth command-address signal CA5 of the precharge command PRE to a logic low level.

After a time interval corresponding to precharge time tRP, the scheduler 55 applies a direct refresh management command DRFM to the semiconductor memory device 200 in synchronization with an edge of the clock signal CK_t without any intervening commands. The semiconductor memory device 200 performs a hammer refresh operation on four victim memory cell rows physically adjacent to a memory cell row corresponding to the hammer address HADDR during a refresh cycle interval tRFC, in response to the direct refresh management command DRFM. During the refresh cycle interval tRFC, generating other commands is inhibited from a time point at the semiconductor memory device 20 receiving the direct refresh management command DRFM.

Figure 20:
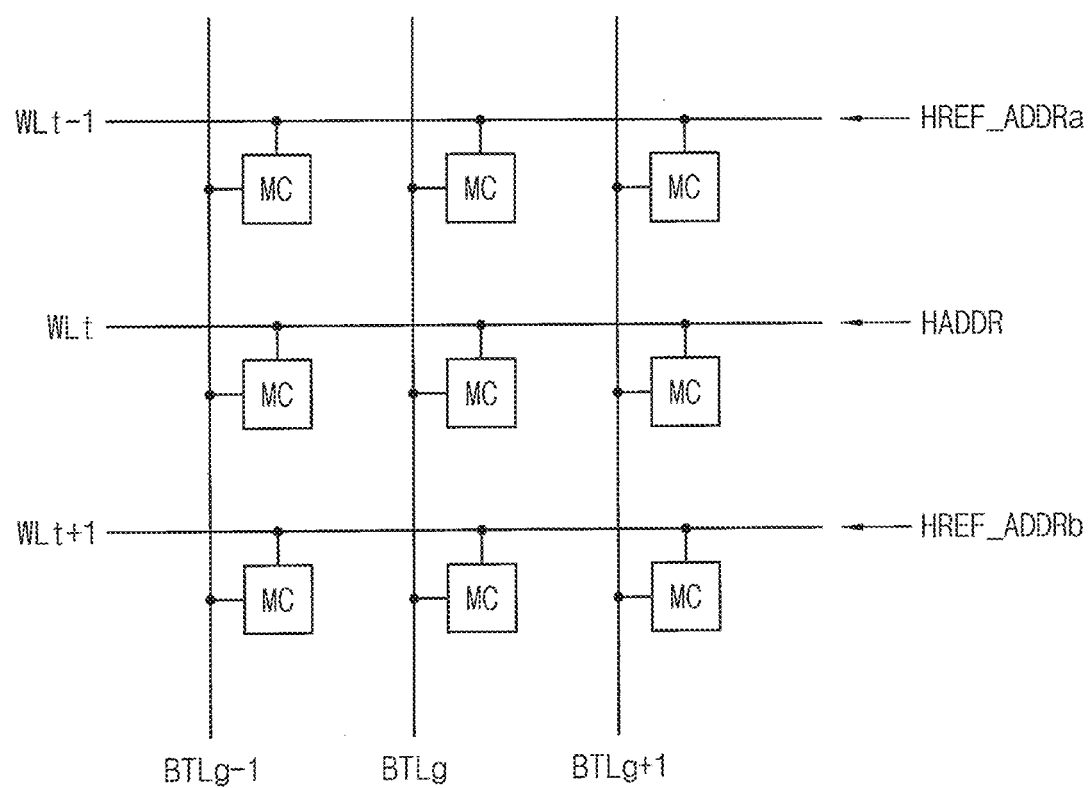
FIG. 20 is a diagram illustrating a portion of a memory cell array for describing generation of hammer refresh addresses in response to the first type of hammer address.

FIG. 20 is a diagram illustrating a portion of a memory cell array for describing generation of hammer refresh addresses in response to the first type of hammer address.

FIG. 20 illustrates three word-lines WLt−1, WLt and WLt+1, three bit-lines BLg−1, BLg and BLg+1 and memory cells MC coupled to the word-lines WLt−1, WLt and WLt+1 and the bit-lines BLg−1, BLg and BLg+1 in the memory cell array. The three word-lines WLt−1, WLt and WLt+1 are extended in a row direction (e.g., D1 direction) and arranged sequentially along a column direction (e.g., D2 direction). The three bit-lines BLg−1, BLg and BLg+1 are extended in the column direction and arranged sequentially along the row direction. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 are affected. As the hammer word-line WLt is accessed more frequently, the cell charges of the memory cells MC coupled to the adjacent word-lines WLt−1 and WLt+1 may be lost more rapidly.

The hammer address generator 440 in FIG. 11 may provide the HREF_ADDR representing the addresses HREF_ADDRa and HREF-ADDRb of the rows (e.g., the word-lines WLt−1 and WLt+1) that are physically adjacent to the row of the hammer address HADDR (e.g., the middle word-line WLt), and a refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 21:
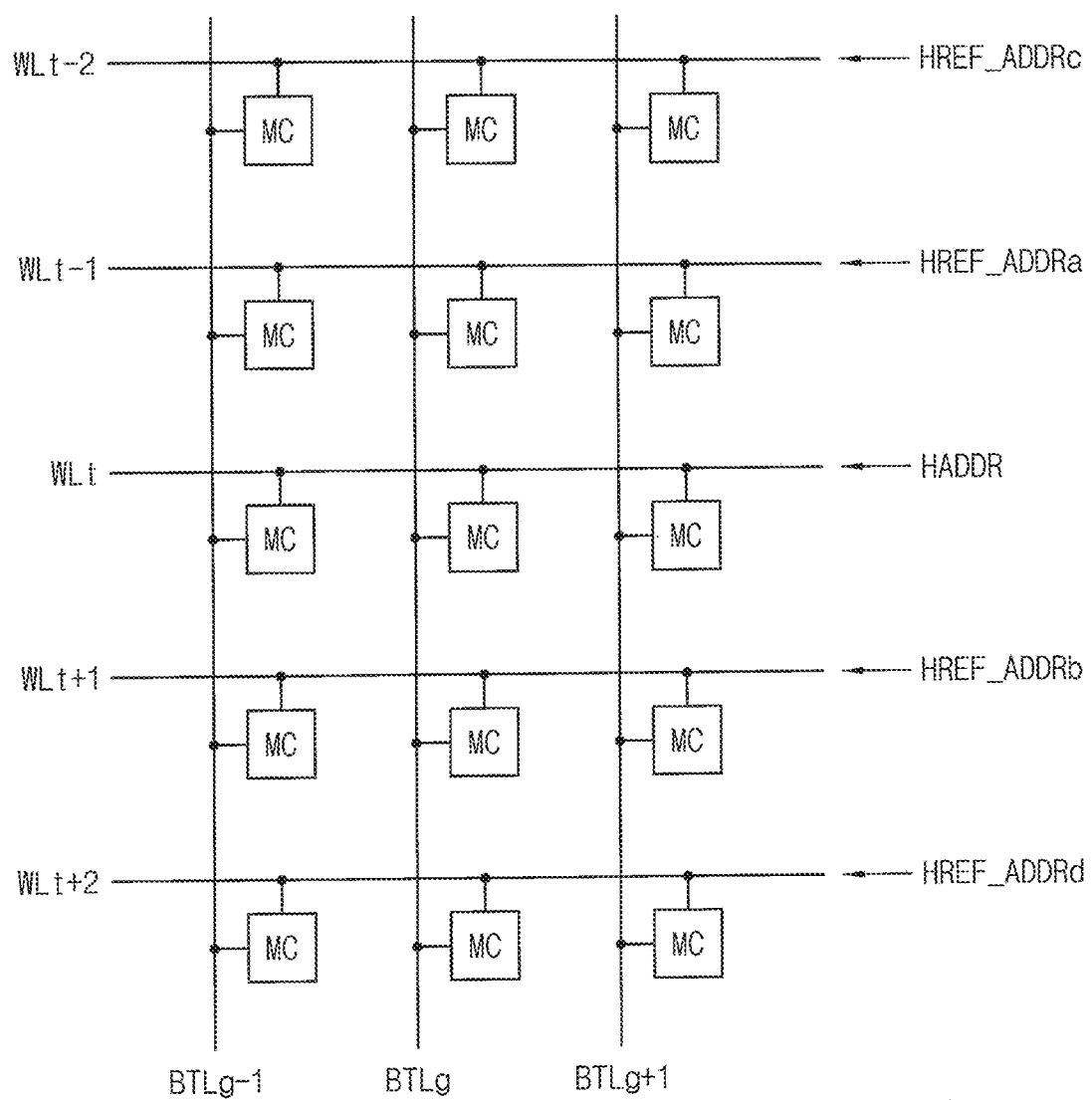
FIG. 21 is a diagram illustrating a portion of a memory cell array for describing generation of hammer refresh addresses in response to the second type of hammer address.

FIG. 21 is a diagram illustrating a portion of a memory cell array for describing generation of hammer refresh addresses in response to the second type of hammer address.

FIG. 21 illustrates five word-lines WLt−2 WLt−1, WLt, WLt+1 and WLt+2, three bit-lines BLg−1, BLg and BLg+1 and memory cells MC coupled to the word-lines WLt−2 WLt−1, WLt, WLt+1 and WLt+2 and the bit-lines BLg−1, BLg and BLg+1 in the memory cell array. The five word-lines WLt−2 WLt−1, WLt, WLt+1 and WLt+2 are extended in a row direction (e.g., D1 direction) and arranged sequentially along a column direction (e.g., D2 direction).

The hammer address generator 440 in FIG. 11 may provide the HREF_ADDR representing addresses HREF_ADDRa, HREF-ADDRb, HREF_ADDRc and HREF-ADDRd of the rows (e.g., the word-lines WLt−2 WLt−1, WLt+1 and WLt+1) that are physically adjacent to the row of the hammer address HADDR (e.g., the middle word-line WLt), and an refresh operation for the adjacent word-lines WLt−2 WLt−1, WLt+1 and WLt+1 may be performed additionally based on (e.g., in response to) the hammer refresh address HREF_ADDR to reduce or possibly prevent the loss of data stored in the memory cells MC.

Figure 23:
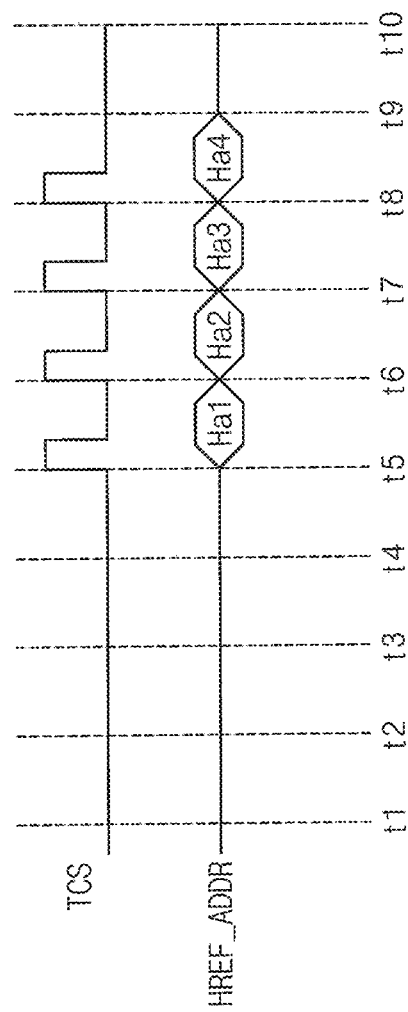
FIG. 23 illustrates an example operation of the refresh control circuit 400 in response to the second type of hammer address.

FIGS. 22A, 22B and 23 are timing diagrams illustrating example operations of a refresh control circuit 400 of FIG. 11 according to example embodiments.

FIGS. 22A and 22B illustrate generations of a refresh clock signal RCK, a direct refresh management signal DRMS, a counter refresh address CREF_ADDR, and a hammer refresh address HREF_ADDR, with respect to a refresh control signal IREF that is activated in a pulse shape. The intervals between the activation time points t1~t15 of the refresh control signal IREF may be regular or irregular.

Referring to FIGS. 11 and 22A, the refresh control logic 410 may activate the refresh clock signal RCK in synchronization with some time points t1~t4, t6~t10 and t12~t15 among the activation time points t1~t15 of the refresh control signal IREF, and may activate the timing control signal TCS with the other time points t5 and tn.

The refresh counter 430 may generate the counter refresh address CREF_ADDR representing the sequentially changing addresses X+1~X+15 in synchronization with the activation time points t1~t4, t6~t10 and t12~t15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the timing control signal TCS.

Referring to FIGS. 11 and 22B, the refresh control logic 410 may activate the refresh clock signal RCK in synchronization with some time points t1~t4 and t7~t10 among the activation time points t1~t10 of the refresh control signal IREF, and may activate the timing control signal TCS with the other time points t5 and t6.

The refresh counter 430 may generate the counter refresh address CREF_ADDR representing the sequentially changing addresses X+1~X+7 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the timing control signal TCS.

FIGS. 22A and 22B illustrate example operations of the refresh control circuit 400 in response to the first type of hammer address.

Referring to FIGS. 11 and 23, The hammer refresh address generator 440 may generate the hammer refresh address HREF_ADDR representing the address Ha1, Ha2, Ha3 and Ha4 of the rows that are physically adjacent to the row of the hammer address in synchronization with the activation time points t5, t6, t7, t8 of the timing control signal TCS.

FIG. 23 illustrates an example operation of the refresh control circuit 400 in response to the second type of hammer address.

Figure 24:
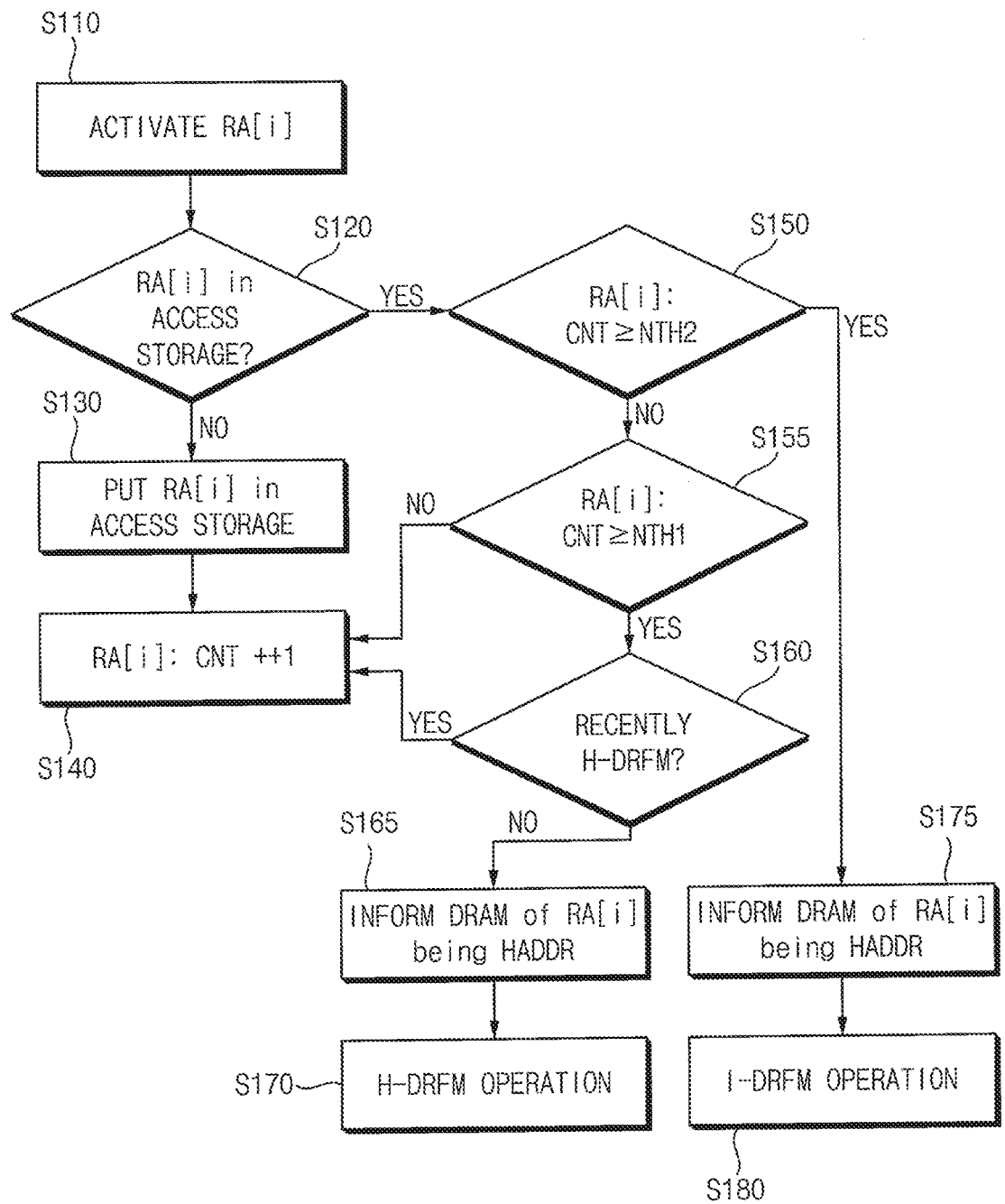
FIG. 24 is a flow chart illustrating an operation of the memory controller in FIG. 1 managing the hammer address according to example embodiments.

FIG. 24 is a flow chart illustrating an operation of the memory controller 30 in FIG. 1 managing the hammer address according to example embodiments.

Referring to FIGS. 1 through 5, 14 through 19 and 24, the scheduler 55 activates a target row address RA[i] designating a memory cell row to be currently accessed (operation S110). The access storage controller 140 determines whether the target row address RA[i] matches one of previous row addresses stored in the access storage 120 (operation S120).

When the target row address RA[i] does not match one of previous row addresses stored in the access storage 120 (NO in operation S120), the access storage controller 140 stores the target row address RA[i] in the access storage 120 as a new entry (operation S130), and increases counting value CNT of the target row address RA[i] by one (operation S140).

When the target row address RA[i] matches one of previous row addresses stored in the access storage 120 (YES in operation S120), the access storage controller 140 determines whether the counting value CNT of the target row address RA[i] is equal to or greater than a second reference number NTH2 (operation S150).

When the counting value CNT of the target row address RA[i] is not equal to or greater than the second reference number NTH2 (NO in operation S150), the access storage controller 140 determines whether the counting value CNT of the target row address RA[i] is equal to or greater than a first reference number NTH1 (operation S155). When the counting value CNT of the target row address RA[i] is not equal to or greater than the first reference number NTH1 (NO in operation S155), the access storage controller increases the counting value CNT of the target row address RA[i] by one (operation S140).

When the counting value CNT of the target row address RA[i] is equal to or greater than the first reference number NTH1 (YES in operation S155), the scheduler 55 determines that the semiconductor memory device 200 is notified (or informed) of the target row address RA[i] corresponding to the hammer address (H-RDRFM) during a refresh interval (operation S160).

When the semiconductor memory device 200 is notified of the target row address RA[i] corresponding to the hammer address during the refresh interval (YES in operation S160), the access storage controller increases the counting value CNT of the target row address RA[i] by one (operation S140).

When the semiconductor memory device 200 is not notified of the target row address RA[i] corresponding to the hammer address during the refresh interval (NO in operation S160), the scheduler 55 informs the semiconductor memory device 200 of the target row address RA[i] corresponding to the hammer address by using a follow-up command such as a precharge command (operation S165) and resets a counter associated with the target row address RA[i]. The scheduler 55 applies a refresh command to the semiconductor memory device 200 such that the semiconductor memory device 200 performs a hammer refresh (H_DRFM) operation on the victim memory cell rows physically adjacent to a memory cell row corresponding to the target row address RA[i] (operation S170). The hammer refresh operation may be a hidden refresh operation to the memory controller 30.

When the counting value CNT of the target row address RA[i] is equal to or greater than the second reference number NTH2 (YES in operation S150), the scheduler 55 informs the semiconductor memory device 200 of the target row address RA[i] corresponding to the hammer address by using a follow-up command such as a precharge command (operation S175) and resets a counter associated with the target row address RA[i]. The scheduler 55 applies a direct refresh management command to the semiconductor memory device 200 such that the semiconductor memory device 200 performs a hammer refresh (H_DRFM) operation on the victim memory cell rows physically adjacent to a memory cell row corresponding to the target row address RA[i] (operation S180).

Figure 25:
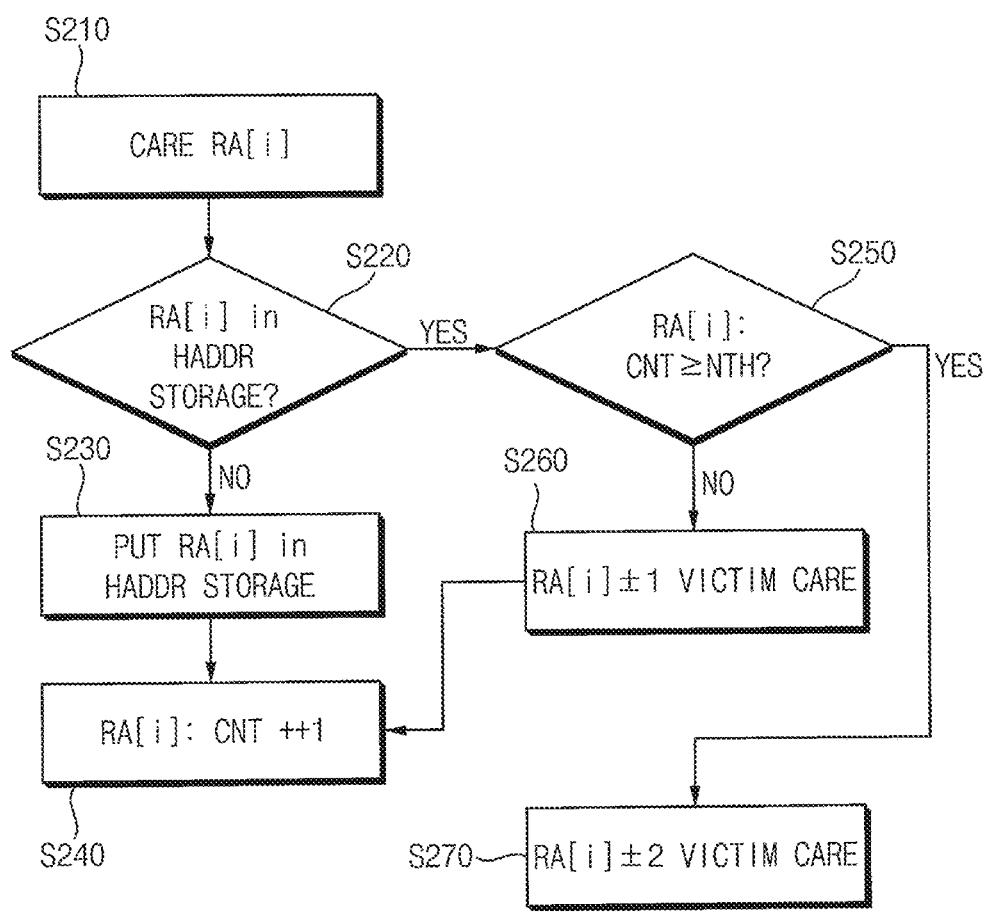
FIG. 25 is a flow chart illustrating that the semiconductor memory device in FIG. 1 performs a hammer refresh operation according to example embodiments.

FIG. 25 is a flow chart illustrating that the semiconductor memory device in FIG. 1 performs a hammer refresh operation according to example embodiments.

Referring to FIGS. 1, 8, 11, 14 through 19 and 25, the refresh control circuit 400 is notified of the target row address RA[i] corresponding to the hammer address (CARE RA[i]) by a follow-up command (operation S210).

The refresh control logic 410 determines whether the target row address RA[i] matches one of previous hammer addresses stored in the hammer address storage 450 (operation S220).

When the target row address RA[i] does not match one of previous hammer addresses stored in the hammer address storage 450 (NO in operation S220), the refresh control logic 410 stores the target row address RA[i] in the hammer address storage 450 as a new entry (operation S230), and increases counting value CNT of the target row address RA[i] by one (operation S240).

When the target row address RA[i] matches one of previous hammer addresses stored in the hammer address storage 450 (YES in operation S220), the refresh control logic 410 determines whether the counting value CNT of the target row address RA[i] is equal to or greater than a reference number NTH (operation S250). The reference number NTH may be four.

When the counting value CNT of the target row address RA[i] is not equal to or greater than the reference number NTH (NO in operation S250), the hammer refresh address generator 440 generates hammer refresh addresses HREF_ADDR of two victim memory cell rows physically adjacent to a memory cell row corresponding to the target row address RA[i] (operation S260) and the refresh control logic 410 increases counting value CNT of the target row address RA[i] by one (operation S240).

When the counting value CNT of the target row address RA[i] is equal to or greater than the reference number NTH (YES in operation S250), the hammer refresh address generator 440 generates hammer refresh addresses HREF_ADDR of four victim memory cell rows physically adjacent to a memory cell row corresponding to the target row address RA[i] (operation S270) and the refresh control logic 410 resets a counter associated with the target row address RA[i].

As mentioned above, the memory controller 30 and the memory system 20 perform the hammer address detection and the refresh execution in the memory controller 30 and the semiconductor memory device 200, respectively, to distribute the burden of the hammer refresh operation, the memory controller 30 applies the direct refresh management command DRFM to the semiconductor memory device 200 in response to the second type of hammer address such that the semiconductor memory device 200 performs the hammer refresh execution operation on the victim memory cell rows immediately and the memory controller 30 applies the refresh command instead of the direct refresh management command DRFM to the semiconductor memory device 200 in response to the first type of hammer address such that the semiconductor memory device 200 performs the hammer refresh execution operation on the victim memory cell rows within a refresh interval. Therefore, the memory system may not degrade performance and/or may not violate command scheduling.

Figure 26:
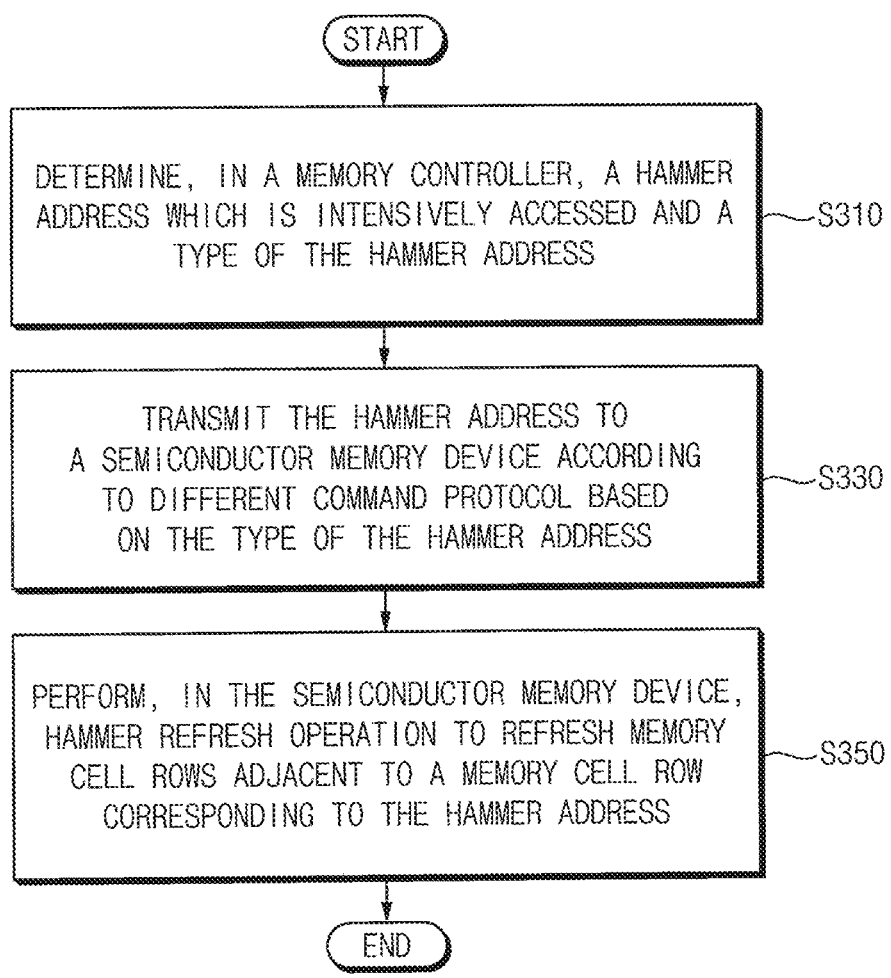
FIG. 26 is a flow chart illustrating a method of operating a memory system according to example embodiments.

FIG. 26 is a flow chart illustrating a method of operating a memory system according to example embodiments.

Referring to FIGS. 1 through 26, there is provided a method of operating a memory system 20 which includes a semiconductor memory device 200 including a plurality of memory cell rows and a memory controller 30 to control the semiconductor memory device 200. Each of plurality of memory cell rows may include a plurality of volatile memory cells.

According to the method, the memory controller 30 determines a hammer address which is intensively access among from the plurality of memory cell rows and a type of the hammer address (operation S310). A row hammer management circuit 100 in the memory controller 30 may count each of access addresses associated with accesses to the plurality of memory cell rows and may determine the hammer address and the type of the hammer address associated with an urgency of management of the hammer address based on the counting values.

A scheduler 55 in the memory controller 30 transmits the hammer address to the semiconductor memory device 200 according to a different command protocol based on the type of the hammer address (operation S330).

The scheduler 55 may transmit the hammer address to the semiconductor memory device 200 according to a first command protocol when the hammer address corresponds to a first type of hammer address whose management is recommended. The scheduler 55 may transmit the hammer address to the semiconductor memory device 200 according to a second command protocol when the hammer address corresponds to a second type of hammer address whose management is immediate.

The semiconductor memory device 200 performs a hammer refresh operation on victim memory cell rows adjacent to a memory cell row corresponding to the hammer address, in response to the command protocol (operation S350).

Figure 27:
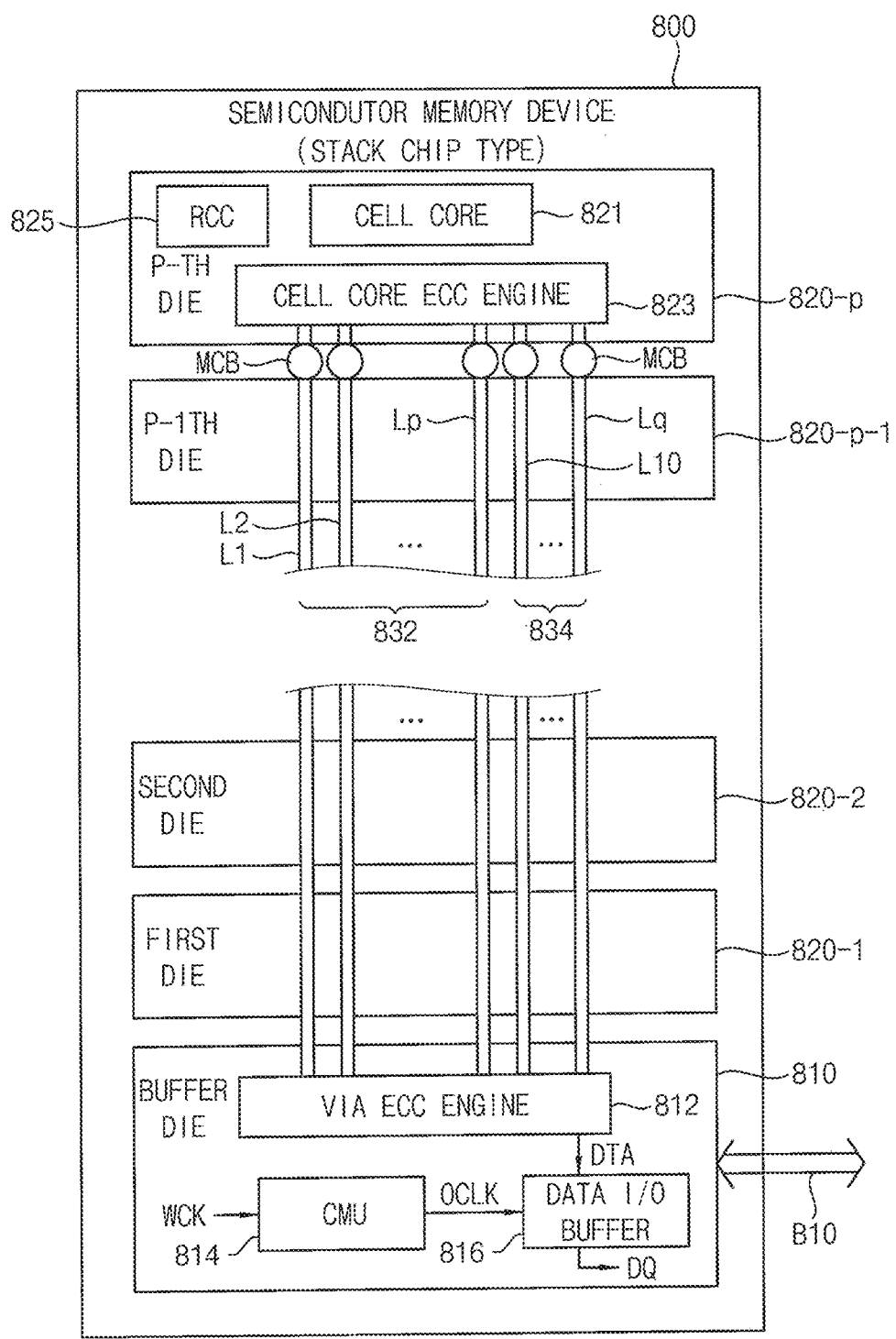
FIG. 27 is a block diagram illustrating a semiconductor memory device according to example embodiments.

FIG. 27 is a block diagram illustrating a semiconductor memory device according to example embodiments.

Referring to FIG. 27, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and conveys data through a plurality of through silicon via (TSV) lines.

At least one of the memory dies 820-1 to 820-p may include a memory core to store data and a cell core ECC engine 823 which generates transmission parity bits (e.g., transmission parity data) based on transmission data to be sent to the at least one buffer die 810 and a refresh control circuit (RCC) 825. The cell core 821 may include a plurality of memory cells having DRAM cell structure.

The refresh control circuit 825 may employ the refresh control circuit 400 of FIG. 11. The refresh control circuit 825 may receive the hammer address from the memory controller 30 and may perform a hammer refresh operation on different number of victim memory cell rows based on a type of the hammer address.

The buffer die 810 may include a via ECC engine 812 which corrects a transmission error using the transmission parity bits when a transmission error is detected from the transmission data received through the TSV liens and generates error-corrected data.

The buffer die 810 may further include a clock management unit (CMU) 814 and a data I/O buffer 816. The CMU 814 may employ the clock correction circuit 610 and the clock generation circuit 630 in FIG. 8, may generate adjusted clock signals whose phase skews are corrected based on the data clock signal WCK and may generate the output clock signal OCLK based on the adjusted clock signals. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-p before the transmission data is sent.

A data TSV line group 832 which is formed at one memory die 820-p may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-p.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 27, the cell core ECC engine 823 may be included in the memory die, the via ECC engine 812 may be included in the buffer die. Accordingly, it may be possible to detect and correct soft data fail. The soft data fail may include a transmission error which is generated due to noise when data is transmitted through TSV lines.

Figure 28:
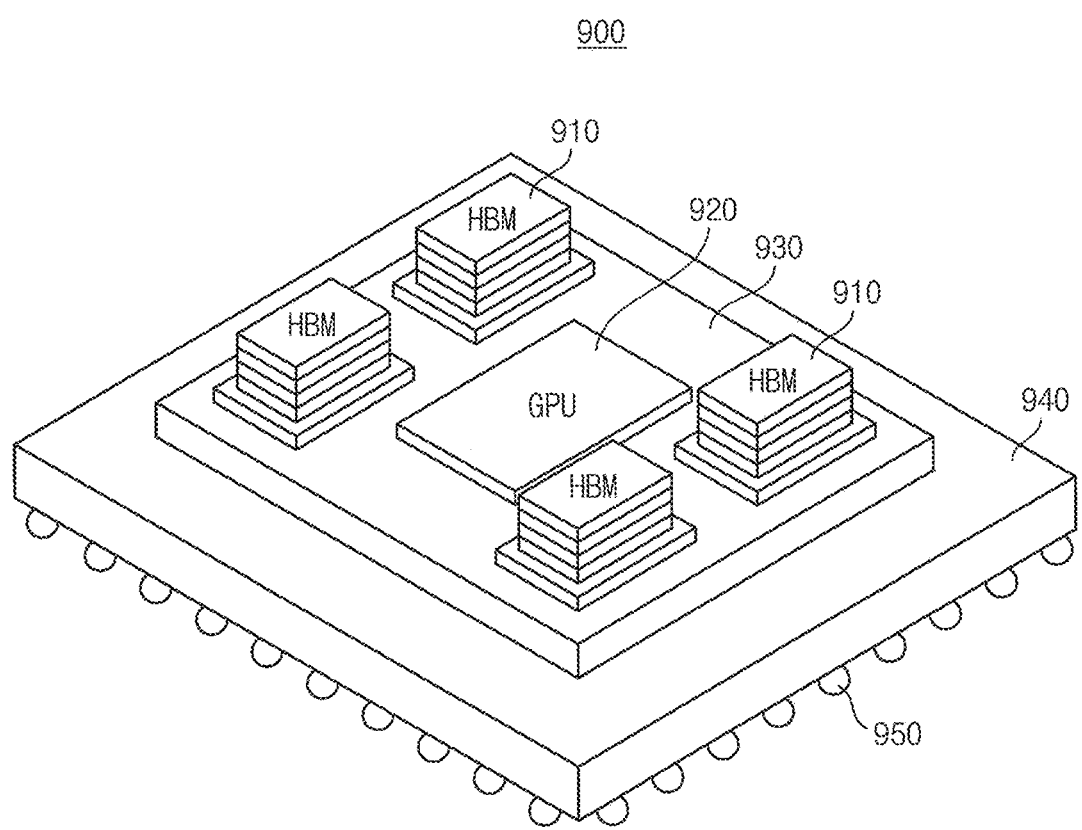
FIG. 28 is a configuration diagram illustrating a semiconductor package including the stacked memory device according to example embodiments.

FIG. 28 is a configuration diagram illustrating a semiconductor package including the stacked memory device according to example embodiments.

Referring to FIG. 28, a semiconductor package 900 may include one or more stacked memory devices 910 and/or a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP).

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies include a refresh control circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concepts may be applied to systems using semiconductor memory devices that employ volatile memory cells and data clock signals. For example, aspects of the present inventive concepts may be applied to systems such as be a smart phone, a navigation system, a notebook computer, a desk top computer and a game console that use the semiconductor memory device as a working memory.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A memory controller configured to control a semiconductor memory device, the memory controller comprising:
   a row hammer management circuit configured to
      count each of access addresses associated with accesses to a plurality of memory cell rows of the semiconductor memory device to store counting values therein; and
      determine a hammer address and a type of the hammer address based on the counting values, the hammer address being associated with at least one memory cell row which is intensively accessed from among the plurality of memory cell rows, the type of the hammer address being associated with an urgency of management of the hammer address; and
   a scheduler configured to transmit the hammer address to the semiconductor memory device with commands having different command protocols based on the type of the hammer address,
   the different command protocols including a first command protocol in response to a first type of hammer address, and a second command protocol different from the first command protocol in response to a second type of hammer address different than the first type of hammer address.

2. The memory controller of claim 1, wherein the row hammer management circuit is configured to:
   determine a target access address as the first type of hammer address in response to a first counting value of the target access address being equal to or greater than a first reference number, the target access address designating a memory cell row which is currently accessed from among the plurality of memory cell rows; and
   determine the target access address as the second type of hammer address in response to the first counting value of the target access address being equal to or greater than a second reference number greater than the first reference number,
   wherein the management of the hammer address for the first type of hammer address is recommended, and the management of the hammer address for the second type of hammer address is immediate.

3. The memory controller of claim 2, wherein the scheduler is configured to:
   transmit the target access address to the semiconductor memory device using a first active command and a second active command which are consecutive and for access operation of the semiconductor memory device; and
   notify the semiconductor memory device of the target access address corresponding to the hammer address using a first follow-up command subsequent to the second active command.

4. The memory controller of claim 3, wherein:
   the first follow-up command corresponds to a precharge command that the memory controller applies to the semiconductor memory device after the memory controller applies the second active command; and
   the scheduler is configured to notify the semiconductor memory device of the target access address corresponding to the hammer address by setting a sixth command/address signal among from first through seventh command/address signals of the precharge command to a logic low level.

5. The memory controller of claim 3, wherein:
   the first follow-up command corresponds to a one of a write command including an auto precharge and a read command including an auto precharge command that the memory controller applies to the semiconductor memory device after the memory controller applies the second active command; and
   the scheduler is configured to notify the semiconductor memory device of the target access address corresponding to the hammer address by using auto precharge information of a seventh command/address signal among from first through seventh command/address signals of the write command or the read command.

6. The memory controller of claim 3, wherein the scheduler is configured to transmit a direct refresh management command subsequent to the first follow-up command to the semiconductor memory device without any intervening command, in response to the hammer address corresponding to the second type of hammer address such that the semiconductor memory device performs a hammer refresh operation on victim memory cell rows adjacent to a memory cell row corresponding to the hammer address.

7. The memory controller of claim 3, wherein the scheduler is configured to transmit a second follow-up command subsequent to the first follow-up command to the semiconductor memory device, in response to the hammer address corresponding to the first type of hammer address such that the semiconductor memory device performs a hammer refresh operation on victim memory cell rows adjacent to a memory cell row corresponding to the hammer address in response to an auto refresh command or a self-refresh entry command.

8. The memory controller of claim 1, wherein the row hammer management circuit includes:
   an access storage configured to store the access addresses and the counting values corresponding to the access addresses; and
   an access storage controller configured to control the access storage and configured to determine the hammer address and the type of the hammer address based on the counting values.

9. The memory controller of claim 8, wherein the access storage controller includes:
an address comparator configured to compare a target row address of a target access address with respective ones of row addresses stored in the access storage to generate a matching signal, the target access address designating a memory cell row which is currently accessed from among the plurality of memory cell rows;
a counter configured to generate a counting value of the counting values based on the matching signal and configured to store the counting value in the access storage; and
a monitor logic connected to the access storage, the monitor logic configured to
selectively store the target row address in the access storage based on the matching signal;
generate a comparison signal by comparing a counting value of the target row address with a first reference number and a second reference number;
determine the hammer address based on the comparing; and
provide the hammer address and the comparison signal to the scheduler.

10. The memory controller of claim 9, wherein the monitor logic is configured to store the target row address in the access storage in response to the matching signal indicating that the target row address does not match the respective ones of the row addresses stored in the access storage.

11. The memory controller of claim 9, wherein the scheduler is configured to notify the semiconductor memory device of the target row address corresponding to the first type of hammer address according to the first command protocol in response to the comparison signal indicating that the counting value associated with the target row address is equal to or greater than the first reference number and is smaller than the second reference number.

12. The memory controller of claim 9, wherein the scheduler is configured to notify the semiconductor memory device of the target row address corresponding to the second type of hammer address according to the second command protocol in response to the comparison signal indicating that the counting value associated with the target row address is equal to or greater than the second reference number.

13. A memory system comprising:
a semiconductor memory device including a memory cell array that includes a plurality of memory cell rows, each including a plurality of volatile memory cells; and
a memory controller configured to
count each of access addresses associated with accesses to the plurality of memory cell rows;
determine a hammer address and a type of the hammer address based on the counting, the hammer address being associated with at least one memory cell row which is intensively accessed from among the plurality of memory cell rows, the type of the hammer address being associated with an urgency of a management of the hammer address; and
transmit the hammer address to the semiconductor memory device with commands having different command protocols based on the type of the hammer address,
the different command protocols including a first command protocol in response to a first type of hammer address, and a second command protocol different from the first command protocol in response to a second type of hammer address different than the first type of hammer address.

14. The memory system of claim 13, wherein the memory controller includes:
a row hammer management circuit configured to count each of the access addresses to store counting values therein and configured to determine the hammer address and the type of the hammer address based on the counting values; and
a scheduler configured to transmit the hammer address to the semiconductor memory device according to the different command protocols based on the type of the hammer address,
wherein the row hammer management circuit is configured to
determine a target access address as the first type of hammer address in response to a first counting value of the target access address being equal to or greater than a first reference number, the target access address designating a memory cell row which is currently accessed from among the plurality of memory cell rows; and
determine the target access address as the second type of hammer address in response to the first counting value of the target access address being equal to or greater than a second reference number greater than the first reference number, and
wherein the management of the hammer address for the first type of hammer address is recommended, and the management of the hammer address for the second type of hammer address is immediate.

15. The memory system of claim 14, wherein the scheduler is configured to:
provide the target access address to the semiconductor memory device using a first active command and a second active command which are consecutive and for access operation of the semiconductor memory device; and
notify the semiconductor memory device of the target access address corresponding to the hammer address using a first follow-up command subsequent to the second active command.

16. The memory system of claim 15, wherein the semiconductor memory device is configured to determine whether to store the target access address as the hammer address based on a hammer flag information included in the first follow-up command, the target access address accompanied by the first active command and the second active command.

17. The memory system of claim 15, wherein the scheduler is configured to transmit a direct refresh management command subsequent to the first follow-up command to the semiconductor memory device without any intervening command, in response to the hammer address corresponding to the second type of hammer address, and
wherein the semiconductor memory device is configured to perform a hammer refresh operation on victim memory cell rows adjacent to a memory cell row corresponding to the hammer address, in response to the direct refresh management command.

18. The memory system of claim 15, wherein the scheduler is configured to transmit a second follow-up command subsequent to the first follow-up command to the semiconductor memory device, in response to the hammer address corresponding to the first type of hammer address, and wherein the semiconductor memory device is configured to perform a hammer refresh operation on victim memory cell rows adjacent to a memory cell row corresponding to the hammer address in response to an auto refresh command or a self-refresh entry command.

19. The memory system of claim 13, wherein the semiconductor memory device further includes:
a refresh control circuit configured to perform a refresh operation on the plurality of memory cell rows and a hammer refresh operation associated with the hammer address,
wherein the refresh control circuit includes
a refresh control logic configured to generate a timing control signal and a type signal indicating the type of the hammer address in response to a hammer event detection signal based on the different command protocols and a refresh management signal;
a hammer address storage configured to store hammer addresses from the memory controller and configured to output the hammer address in response to the timing control signal; and
a mapper configured to generate hammer refresh addresses designating addresses of victim memory cell rows adjacent to a memory cell row corresponding to the hammer address output from the hammer address storage, and
wherein the mapper is configured to
generate a first number of the hammer addresses in response to the hammer address corresponding to the first type of hammer address; and
generate a second number of the hammer addresses in response to the hammer address corresponding to the second type of hammer address, the second number being greater than the first number.

20. A memory system comprising:
a semiconductor memory device including a memory cell array that includes a plurality of memory cell rows, each including a plurality of volatile memory cells; and
a memory controller configured to
count each of access addresses associated with accesses to the plurality of memory cell rows;
determine a hammer address and a type of the hammer address based on the counting, the hammer address being associated with at least one memory cell row which is intensively accessed from among the plurality of memory cell rows, the type of the hammer address being associated with an urgency of a management of the hammer address; and
transmit the hammer address to the semiconductor memory device with commands having different command protocols based on the type of the hammer address,
wherein the memory controller includes
a row hammer management circuit configured to count each of the access addresses to store counting values therein and configured to determine the hammer address and the type of the hammer address based on the counting values; and
a scheduler configured to transmit the hammer address to the semiconductor memory device according to the different command protocols based on the type of the hammer address,
the different command protocols including a first command protocol in response to a first type of hammer address, and a second command protocol different from the first command protocol in response to a second type of hammer address different than the first type of hammer address, and
wherein the semiconductor memory device further includes
a refresh control circuit configured to generate hammer refresh address designating addresses of victim memory cell rows adjacent to a memory cell row corresponding to the hammer address based on the hammer address.

* * * * *